US011681327B2

(12) United States Patent
Crowley et al.

(10) Patent No.: US 11,681,327 B2
(45) Date of Patent: Jun. 20, 2023

(54) ELECTRONIC DEVICE

(71) Applicant: Apple Inc., Cupertino, CA (US)

(72) Inventors: Patrick J. Crowley, San Jose, CA (US); Rebecca J. Mikolajczyk, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 349 days.

(21) Appl. No.: 17/019,132

(22) Filed: Sep. 11, 2020

(65) Prior Publication Data

US 2021/0392422 A1    Dec. 16, 2021

Related U.S. Application Data

(60) Provisional application No. 63/037,987, filed on Jun. 11, 2020.

(51) Int. Cl.
| | | |
|---|---|---|
| H04R 1/02 | (2006.01) | |
| H04R 1/28 | (2006.01) | |
| G06F 1/16 | (2006.01) | |
| G06F 3/041 | (2006.01) | |
| H05K 5/00 | (2006.01) | |
| H01Q 1/22 | (2006.01) | |

(52) U.S. Cl.
CPC ............ *G06F 1/163* (2013.01); *G06F 1/1643* (2013.01); *G06F 3/0412* (2013.01); *H01Q 1/2283* (2013.01); *H04R 1/025* (2013.01); *H04R 1/026* (2013.01); *H04R 1/2803* (2013.01); *H05K 5/0017* (2013.01); *H05K 5/0026* (2013.01)

(58) Field of Classification Search
CPC ...... H04R 1/026; H04R 1/025; H04R 1/2803; G06F 1/163
USPC ......................................................... 381/388
See application file for complete search history.

(56) References Cited

U.S. PATENT DOCUMENTS

| | | |
|---|---|---|
| 6,278,873 B1 | 8/2001 | Itakura et al. |
| 7,151,496 B2 | 12/2006 | Casagrande et al. |
| 8,773,847 B2 | 7/2014 | Byun et al. |
| 8,933,902 B2 | 1/2015 | Yeh et al. |
| 9,356,661 B2 | 5/2016 | Samardzija et al. |
| 9,640,858 B1 | 5/2017 | Islam et al. |

(Continued)

FOREIGN PATENT DOCUMENTS

| | | |
|---|---|---|
| CN | 105467831 A | 4/2016 |
| CN | 108566764 A | 9/2018 |

(Continued)

OTHER PUBLICATIONS

Extended European Search Report for EP Application No. 20209800.0, dated May 21, 2021 (10 pp.).

*Primary Examiner* — Sean H Nguyen

(74) *Attorney, Agent, or Firm* — Dorsey & Whitney LLP

(57) ABSTRACT

An electronic device can include a housing at least partially defining an internal volume and an aperture in communication with the internal volume and an ambient environment. A speaker module can be positioned at the aperture and sealed to the housing to define a liquid barrier. The speaker module can include a metallic support member partially defining the internal volume and a flat mounting surface, a magnet affixed to the flat surface, a speaker module enclosure affixed to the metallic support member, and a diaphragm carried by the speaker module enclosure and positioned opposite the magnet.

20 Claims, 35 Drawing Sheets

(56) References Cited

U.S. PATENT DOCUMENTS

| | | |
|---|---|---|
| 9,774,087 B2 | 9/2017 | Chang et al. |
| 10,097,245 B2 | 10/2018 | Kim et al. |
| 10,271,299 B1 | 4/2019 | Sayem et al. |
| 10,297,909 B2 | 5/2019 | Kim et al. |
| 10,312,571 B2 | 6/2019 | Edwards et al. |
| 10,476,139 B2 | 11/2019 | Park et al. |
| 10,601,133 B2 | 3/2020 | Lee et al. |
| 10,862,216 B1 | 12/2020 | Ayala Vazquez et al. |
| 10,965,157 B2 | 3/2021 | Lee et al. |
| 11,322,848 B2 | 5/2022 | Lee et al. |
| 11,431,082 B2 | 8/2022 | Oh |
| 2007/0194633 A1* | 8/2007 | Ueda ............... H04R 9/025 381/396 |
| 2011/0012796 A1 | 1/2011 | Kim et al. |
| 2013/0016059 A1 | 1/2013 | Lowles et al. |
| 2013/0083496 A1 | 4/2013 | Franklin et al. |
| 2014/0225786 A1 | 8/2014 | Lyons et al. |
| 2014/0360856 A1 | 12/2014 | Mizumoto et al. |
| 2015/0147556 A1 | 5/2015 | Sasaki et al. |
| 2015/0237461 A1 | 8/2015 | Goyal et al. |
| 2015/0349410 A1 | 12/2015 | Russell et al. |
| 2015/0351292 A1 | 12/2015 | Chang et al. |
| 2016/0056533 A1 | 2/2016 | Nissinen et al. |
| 2016/0058375 A1* | 3/2016 | Rothkopf ............... G04B 39/02 600/323 |
| 2016/0092005 A1 | 3/2016 | Toyoshima et al. |
| 2016/0255733 A1 | 9/2016 | Jung et al. |
| 2016/0261032 A1 | 9/2016 | Chang et al. |
| 2016/0274398 A1 | 9/2016 | Hirakata et al. |
| 2016/0308272 A1 | 10/2016 | Standke et al. |
| 2016/0323428 A1 | 11/2016 | Kim et al. |
| 2016/0327986 A1* | 11/2016 | Farahani ............... G06F 1/169 |
| 2016/0344089 A1 | 11/2016 | Baik et al. |
| 2016/0357079 A1 | 12/2016 | Chen et al. |
| 2017/0033439 A1 | 2/2017 | Liu et al. |
| 2017/0045916 A1 | 2/2017 | Kim et al. |
| 2018/0084323 A1 | 3/2018 | Luce et al. |
| 2019/0041907 A1 | 2/2019 | Kim et al. |
| 2019/0069076 A1 | 2/2019 | Tsang et al. |
| 2019/0072903 A1* | 3/2019 | Park ............... G04G 17/04 |
| 2019/0094969 A1 | 3/2019 | Wen et al. |
| 2019/0230803 A1 | 7/2019 | Liao et al. |
| 2019/0235586 A1 | 8/2019 | Tani et al. |
| 2019/0250669 A1 | 8/2019 | Liao et al. |
| 2019/0311172 A1 | 10/2019 | Kang et al. |
| 2019/0350554 A1 | 11/2019 | Wildes et al. |
| 2020/0019264 A1 | 1/2020 | Kadota et al. |
| 2020/0136243 A1 | 4/2020 | Shin et al. |
| 2020/0169816 A1* | 5/2020 | Kim ............... G06F 1/1658 |
| 2020/0177979 A1* | 6/2020 | Cho ............... H04M 1/0266 |
| 2020/0192425 A1 | 6/2020 | Wei et al. |
| 2020/0196046 A1* | 6/2020 | Park ............... H04M 1/035 |
| 2020/0404808 A1 | 12/2020 | Kim et al. |
| 2021/0034099 A1 | 2/2021 | Liao et al. |
| 2021/0313670 A1 | 10/2021 | Taga et al. |
| 2022/0027013 A1 | 1/2022 | Kim et al. |
| 2022/0043554 A1 | 2/2022 | Chang et al. |

FOREIGN PATENT DOCUMENTS

| | | |
|---|---|---|
| EP | 1416550 A1 | 5/2004 |
| EP | 2775376 A1 | 9/2014 |
| KR | 20010110336 A | 12/2001 |
| KR | 20130032326 A | 4/2013 |
| KR | 20180137599 A | 12/2018 |
| KR | 20190026202 A | 3/2019 |
| WO | 0135173 A1 | 5/2001 |
| WO | 2011147843 A1 | 12/2011 |
| WO | 2014062352 A1 | 4/2014 |
| WO | 2019045271 A1 | 3/2019 |

* cited by examiner

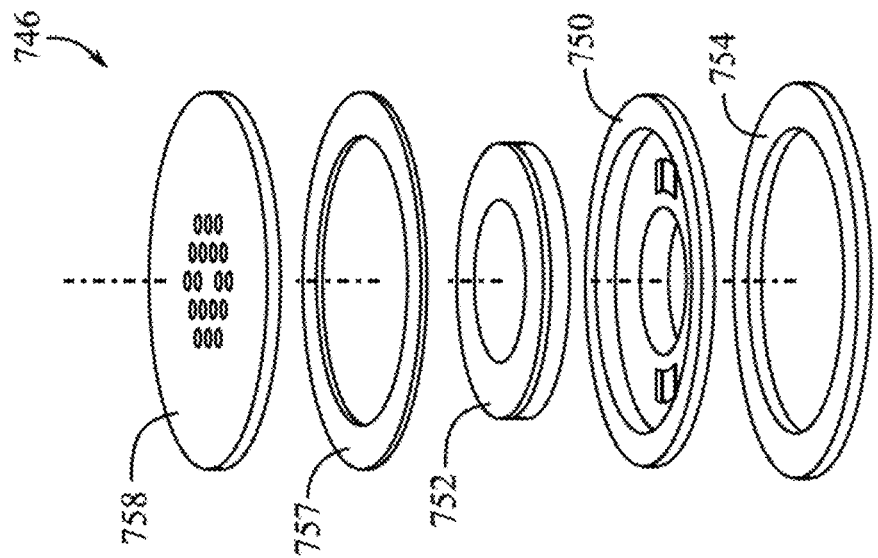
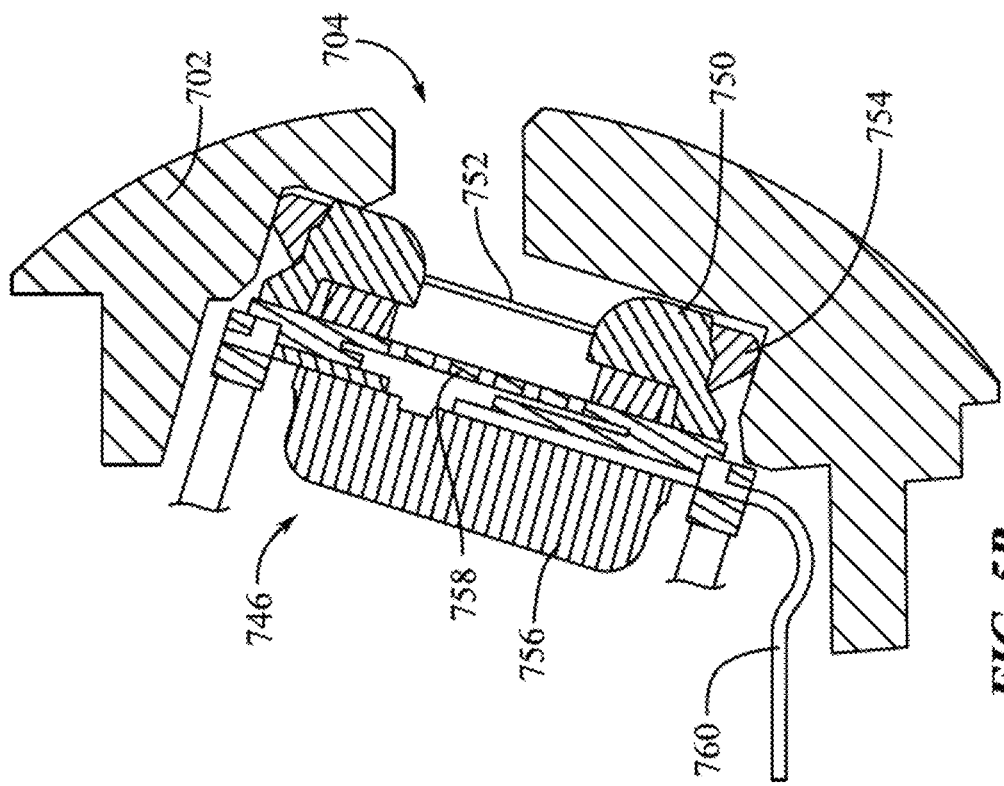
FIG. 5C
FIG. 5B

ELECTRONIC DEVICE

CROSS-REFERENCE TO RELATED APPLICATION(S)

This claims priority to U.S. Provisional Patent Application No. 63/037,987, filed 11 Jun. 2020, and entitled "ELECTRONIC DEVICE," the entire disclosure of which is hereby incorporated by reference.

FIELD

The described embodiments relate generally to electronic devices. More particularly, the present embodiments relate to wearable electronic devices.

BACKGROUND

Electronic devices are increasingly being designed with device portability in mind, for example to allow users to use these devices in a wide variety of situations and environments. In the context of wearable devices, these devices can be designed to include many different functionalities and to be operated in many different locations and environments. The components of an electronic device, for example, the processors, memory, antennas, display, and other components can partially determine a level of performance of the electronic device. Further, the arrangement of these components with respect to one another in the device can also determine the level of performance of the electronic device.

Continued advances in electronic devices and their components have enabled considerable increases in performance. Existing components and structures for electronic devices can, however, limit the levels of performance of such devices. For example, while some components can achieve high levels of performance in some situations, the inclusion of multiple components in devices sized to enhance portability can limit the performance of the components, and thus, the performance of the device. Consequently, further tailoring and arrangement of components for electronic devices to provide additional or enhanced functionality, without introducing or increasing undesirable device properties, can be desirable.

SUMMARY

According to some aspects of the present disclosure, a speaker module can comprise an enclosure defining an aperture, a diaphragm positioned in the aperture, an integrated acoustic and structural component affixed to the enclosure, the integrated acoustic and structural component comprising a metallic support member defining an exterior surface of the speaker module and defining a substantially flat surface, a magnet affixed to the substantially flat surface, and an adhesive layer bonding the enclosure to the metallic support member.

In some examples, the support member comprises stainless steel. The support member comprises a 17-4 stainless steel alloy. The support member defines a fixture receiving aperture, and the device can further comprise a speaker securing fixture component disposed in the fixture receiving aperture. The device can further comprise a pressure sensor module disposed on the support member. The device can further comprise a flexible electrical connector, the flexible electrical connector comprising a first portion electrically connected to a driver of the speaker module, a second portion electrically connected to the pressure sensor module, and a connection portion in electrical communication with the first portion and the second portion. The first portion and the second portion are shaped to lay substantially flat against a surface of the support member, and the connection portion is shaped to extend away from the surface. The magnet has a substantially rectangular shape. The magnet comprises a first magnet, and the integrated acoustic and structural component further comprises a second magnet affixed to the substantially flat surface, and a third magnet affixed to the substantially flat surface.

According to some aspects, an electronic device can comprise a housing at least partially defining an internal volume and an aperture in communication with the internal volume and an ambient environment, and a speaker module positioned at the aperture and sealed to the housing to define a liquid barrier, the speaker module comprising a metallic support member partially defining the internal volume and a flat mounting surface, a magnet affixed to the flat surface, a speaker module enclosure affixed to the metallic support member, and a diaphragm carried by the speaker module enclosure and positioned opposite the magnet.

In some examples, the electronic device is water resistant to a depth of at least 50 m. The speaker module further comprises a pressure sensor disposed on the metallic support member and in communication with the ambient environment through the aperture. The metallic support member has a constant thickness at a location of the magnet. The flat surface has a flatness of less than about 0.05. The speaker module has a thickness of less than about 5 mm. The metallic support member is formed by metal injection molding.

According to some aspects, a speaker module can comprise a metallic support member defining an exterior surface of the speaker module and a planar mounting surface having a height and a width greater than the height, a first magnet affixed to the mounting surface adjacent to a first edge, a second magnet affixed to the mounting surface adjacent to a second edge, a third magnet affixed to the mounting surface between the first magnet and the second magnet, the mounting surface having a constant thickness across an entire area of the third magnet, and an enclosure affixed to the metallic support member, the enclosure at least partially defining an internal volume encompassing the first magnet, the second magnet, and the third magnet.

In some examples, the first magnet, the second magnet, and the third magnet comprise permanent magnets. The metallic support member comprises stainless steel. The metallic support member is metal injection molded.

BRIEF DESCRIPTION OF THE DRAWINGS

The disclosure will be readily understood by the following detailed description in conjunction with the accompanying drawings, wherein like reference numerals designate like structural elements, and in which:

FIG. 5B shows a cross-sectional view of the electronic device of FIG. 5A.

FIG. 5C shows an exploded view of a component of the electronic device of FIG. 5A.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The architecture and components of the electronic devices described herein can allow for configurations and designs that can maximize the available space or volume in an internal volume defined by a housing of the device that is available to be occupied by one or more components. For example, certain aspects of device performance, such as battery life, can be improved by increasing the size or volume of the battery of the device. Additionally, or alternatively, the device itself could be reduced in size while achieving similar or even improved levels of performance.

In addition to saving space or providing other useful or desirable features, the architectures and components described herein can also present challenges to traditional techniques for grounding or tuning antennas present in the device. Accordingly, the devices and components described herein can include configurations and features that allow for the optimization and improvement of the performance of one or more antennas contained in such a device. For example, one or more components can act as both operational components and antenna radiating elements. The grounding of various components of the device, as well as the antennas, can also be controlled, tuned, or designed in order to achieve desired levels of performance.

These and other embodiments are discussed below with reference to FIGS. 1-13D. However, those skilled in the art will readily appreciate that the detailed description given herein with respect to these Figures is for explanatory purposes only and should not be construed as limiting.

Figure 1A:
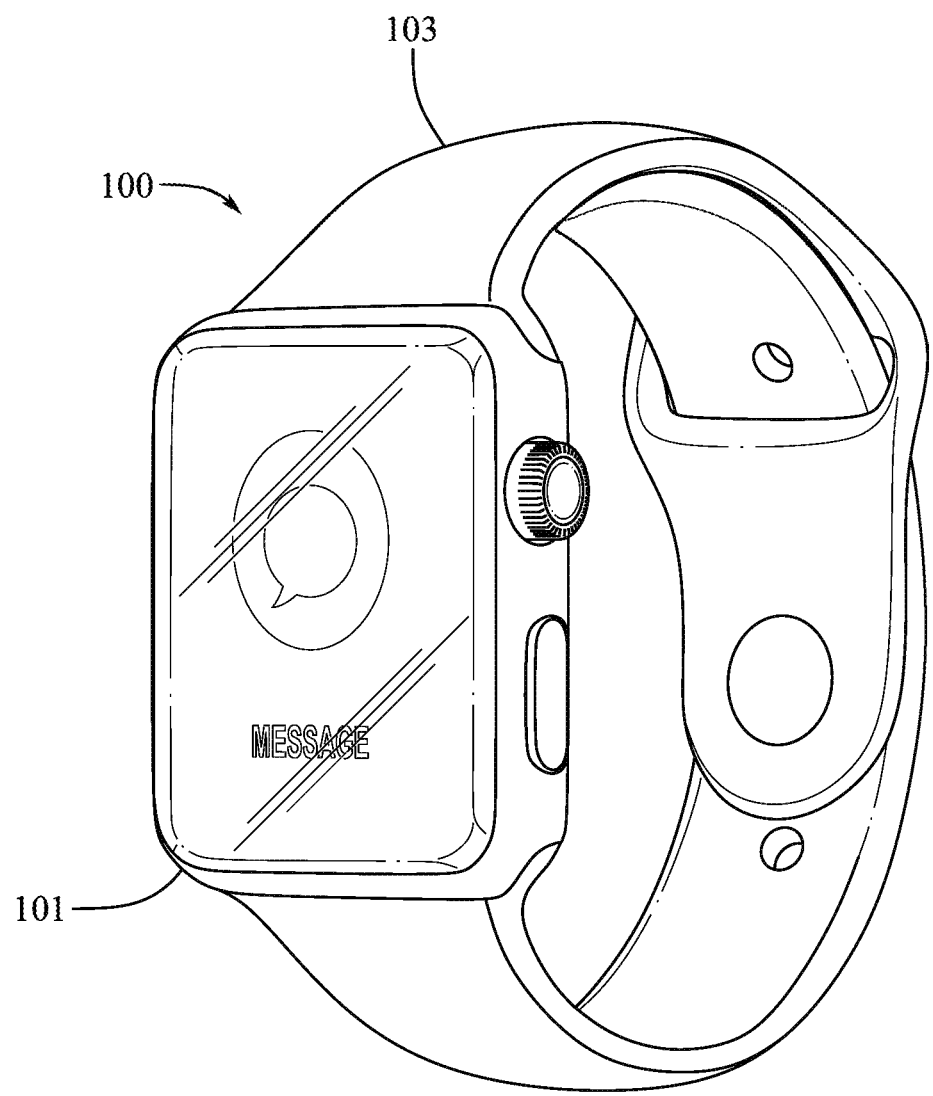
FIG. 1A shows a perspective view of an electronic device.

FIG. 1A shows an example of an electronic device 100. The electronic device shown in FIG. 1A is a watch, such as a smartwatch. The smartwatch of FIG. 1A is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device, or a consumer device. In some examples, the electronic device 100 can include a housing 101 that can carry operational components, for example, in an internal volume at least partially defined by the housing. The electronic device 100 can also include a strap 103, or other retaining component that can secured the device 100 to a body of a user as desired. Further details of the electronic device are provided below with reference to FIG. 1B.

Figure 1B:
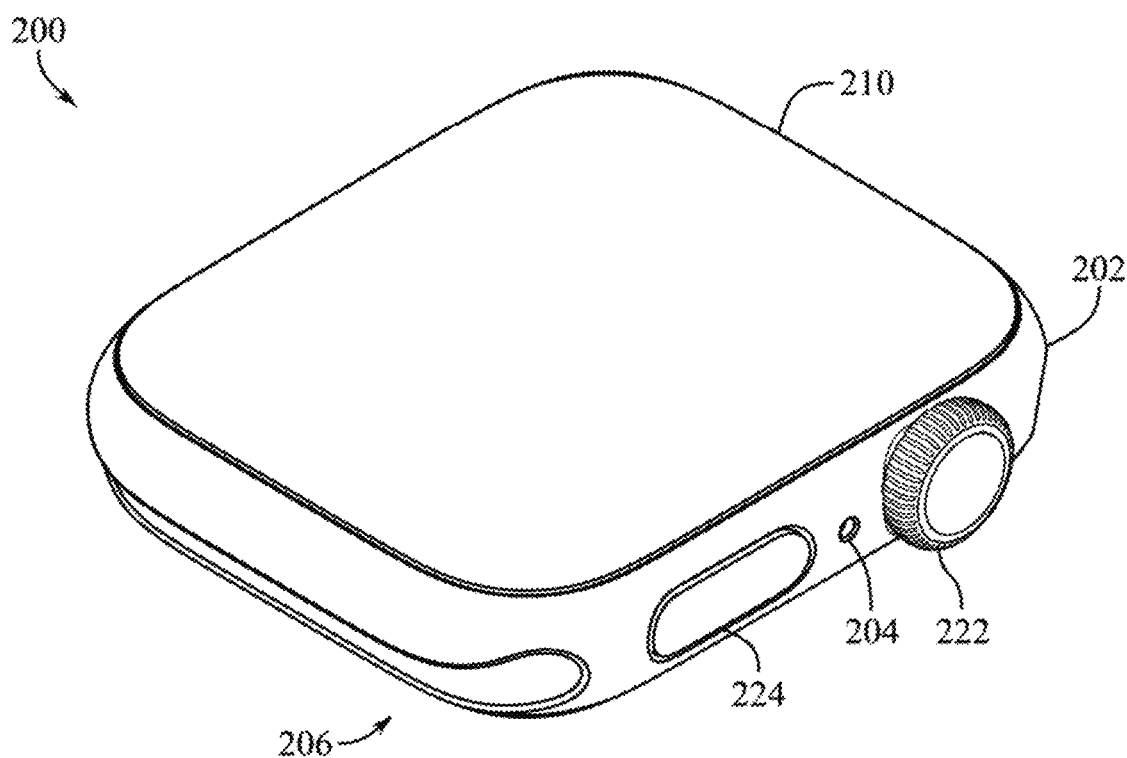
FIG. 1B shows a top perspective view of an electronic device.

FIG. 1B illustrates a smartwatch 200 that can be substantially similar to, and can include some or all of the features of the devices described herein, such as electronic device 100. The device 200 can include a housing 202, and a display assembly 210 attached to the housing. The housing 202 can substantially define at least a portion of an exterior surface of the device 200.

The display assembly 210 can include a glass, a plastic, or any other substantially transparent exterior layer, material, component, or assembly. The display assembly 210 can include multiple layers, with each layer providing a unique function, as described herein. Accordingly, the display assembly 210 can be, or can be a part of, an interface component. The display assembly 210 can define a front exterior surface of the device 200 and, as described herein, this exterior surface can be considered an interface surface. In some examples, the interface surface defined by display assembly 210 can receive inputs, such as touch inputs, from a user.

In some examples, the housing 202 can be a substantially continuous or unitary component and can define one or more openings to receive components of the electronic device 200. In some examples, the device 200 can include input components such as one or more buttons 224 and/or a crown 222 that can be disposed in the openings. In some examples, a material can be disposed between the buttons 224 and/or crown 222 and the housing 202 to provide an airtight and/or watertight seal at the locations of the openings. The housing 202 can also define one or more openings or apertures, such as aperture 204 that can allow for sound to pass into or out of the internal volume defined by the housing 202. For example, the aperture 204 can be in communication with a microphone component disposed in the internal volume. In some examples, the housing 202 can define or include a feature, such as an indentation 206 to removably couple the housing 202 and a strap or retaining component.

Figure 1C:
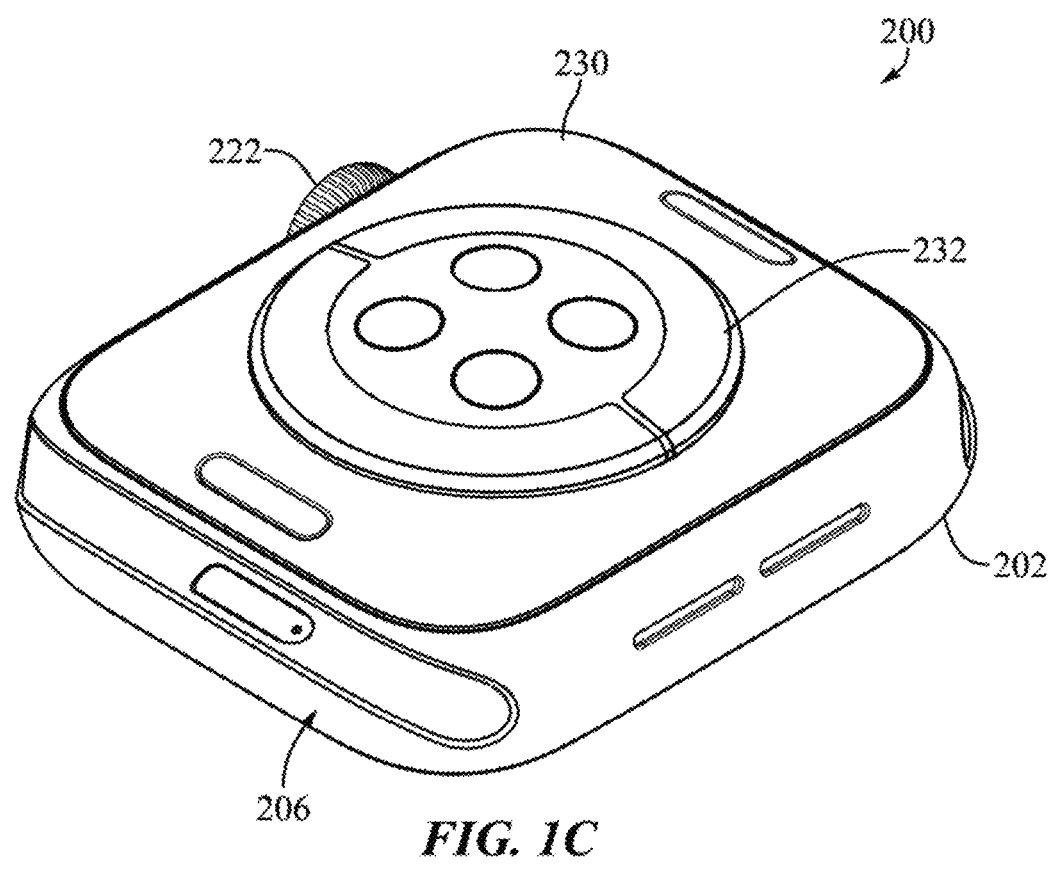
FIG. 1C shows a bottom perspective view of the electronic device of FIG. 1B.

FIG. 1C shows a bottom perspective view of the electronic device 200. The device 200 can include a back cover 230 that can be attached to the housing 202, for example, opposite the display assembly 210. The back cover 230 can include ceramic, plastic, metal, or combinations thereof. In some examples, the back cover 230 can include an at least partially electromagnetically transparent component 232. The electromagnetically transparent component 232 can be transparent to any desired wavelengths of electromagnetic radiation, such as visible light, infrared light, radio waves, or combinations thereof. In some examples, the electromagnetically transparent component 232 can allow sensors and/or emitters disposed in the housing 202 to communicate with the external environment. Together, the housing 202, display assembly 210 and back cover 230 can substantially define an internal volume and an external surface of the device 200.

Figure 1D:
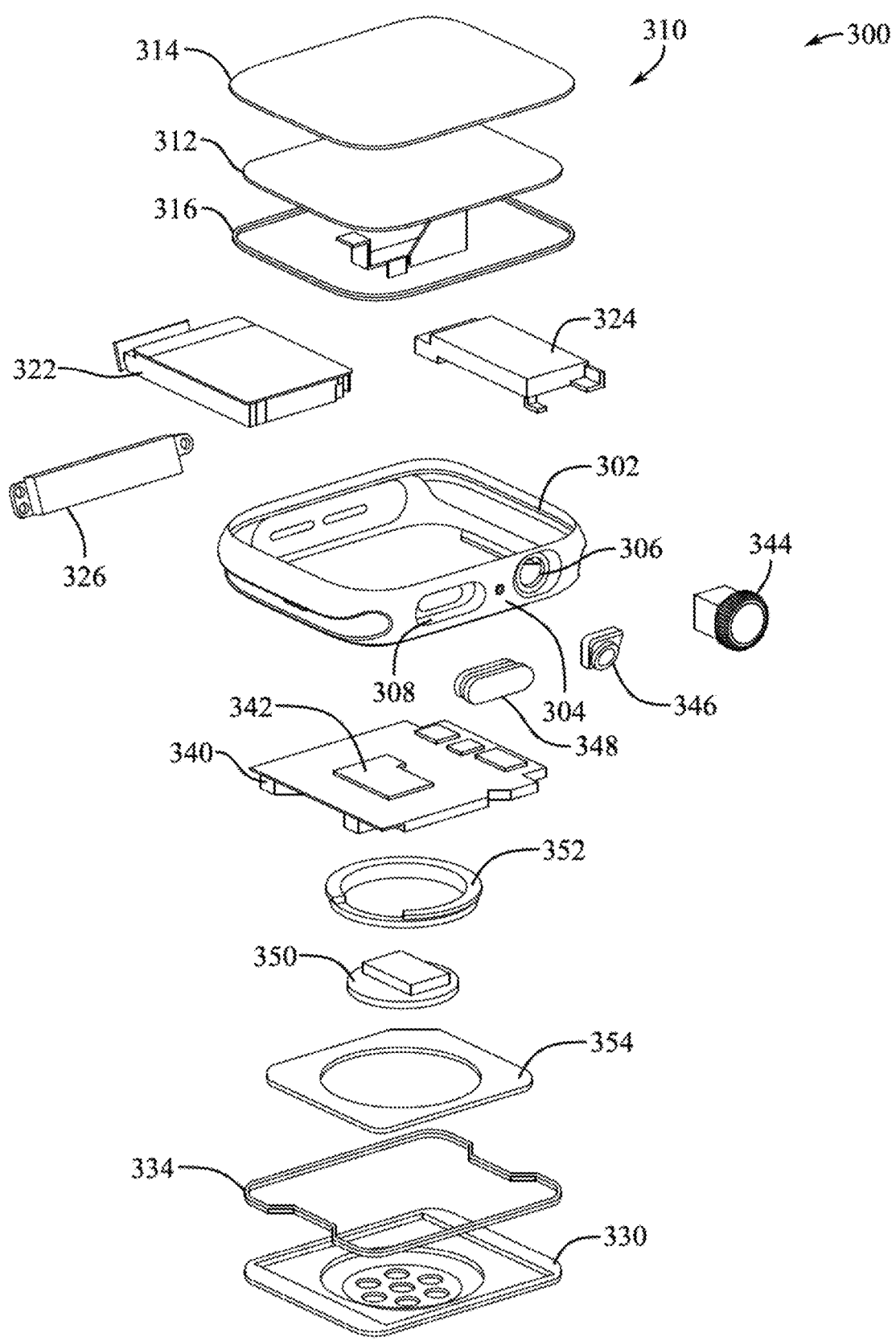
FIG. 1D shows an exploded view of an electronic device.

FIG. 1D illustrates an exploded view of a smartwatch 300 that can be substantially similar to, and can include some or all of the features of the devices described herein, such as electronic devices 100 and 200. The device 300 can include a housing 302, a display assembly 310, and a back cover 330. Together, the housing 302, display assembly 310, and back cover 330 can define an exterior surface and an internal volume of the device 300.

The housing 302 can be a substantially continuous or unitary component, and can define one or more openings 304, 306, 308 to receive components of the electronic device 300 and/or to provide access to an internal portion of the electronic device 300. In some examples, the device 300 can include input components such as one or more buttons 348 and/or a crown 344 that can be disposed in the openings 306, 308. A microphone 346 can be disposed in the internal volume in communication with the external or ambient environment through the opening 304.

The display assembly 310 can be received by and can be attached to the housing 302. The display assembly can include a cover 314 including a transparent material, such as plastic, glass, and/or ceramic. The display assembly 310 can also include a display stack 312 that can include multiple layers and components, each of which can perform one or more desired functions. For example, the display stack 312 can include a display layer 312 that can include a touch detection layer or component, a force sensitive layer or component, and one or more display layers or components that can include one or more pixels and/or light emitting portions to display visual content and/or information to a user. In some examples, the display layer or component 312 can include a liquid crystal display (LCD), a light emitting diode (LED) display, an organic light emitting diode (OLED) display, and/or any other form of display. The display layer 312 can also include one or more electrical connectors to provide signals and/or power to the display layer 312 from other components of the device 300.

In some examples, the device 300 can include a gasket or seal 316 that can be disposed between the display assembly 310 and the housing 302 to substantially define a barrier to the ingress of liquids or moisture into the internal volume from the external environment at the location of the seal 316. As described herein, the seal 316 can include polymer, metal, and/or ceramic materials. The device 300 can also include a seal 334 that can be disposed between the housing 302 and the back cover 330 to substantially define a barrier to the ingress of liquids or moisture into the internal volume from the external environment at the location of the seal 334. As described herein, the seal 334 can include polymer, metal, and/or ceramic materials. The seal 334 can be substantially similar to and can include some or all of the features of the seal 316.

The device 300 can also include internal components, such as a haptic engine 324, a battery 322, and a logic board 340, also referred to as a main logic board 340 that can include a system in package (SiP) 342 disposed thereon, including one or more integrated circuits, such as processors, sensors, and memory. The SiP can also include a package.

In some examples, internal components can be disposed below the main logic board 340 and can be disposed at least partially in a portion of the internal volume defined by the back cover 330. For example, the device 300 can include an electromagnetic shielding component, otherwise referred to as an e-shield 352 that can shield other components in the device 300 from electromagnetic radiation from the ambient environment and/or as emitted by other components in the device 300. The device 300 can also include a second logic board 350 that can be in communication with one or more sensors or emitters of the device 300, for example to receive information or signals from an external environment. In some examples, the second logic board 350 can also include a SiP. In some examples, the device 300 can include one or more wireless antennas, such as the antenna 354 that can be in electrical communication with one or more other components of the device 300. In some examples, the antenna 354 can receive and/or transmit wireless signals at one or more frequencies and can be, for example, one or more of a cellular antenna such as an LTE antenna, a Wi-Fi antenna, a Bluetooth antenna, a GPS antenna, a multifrequency antenna, and the like. The antenna 354 can be communicatively coupled to one or more additional components of the electronic device 300

The internal components can be disposed within the internal volume defined at least partially by the housing 302, and can be affixed to the housing 302 via adhesives, internal surfaces, attachment features, threaded connectors, studs, posts, or other features, that are formed into, defined by, or otherwise part of the housing 302 and/or the cover 318 and/or back cover 330.

Any number or variety of components in any of the configurations described herein can be included in an electronic device, as described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIGS. 2A-3B.

Figure 2A:
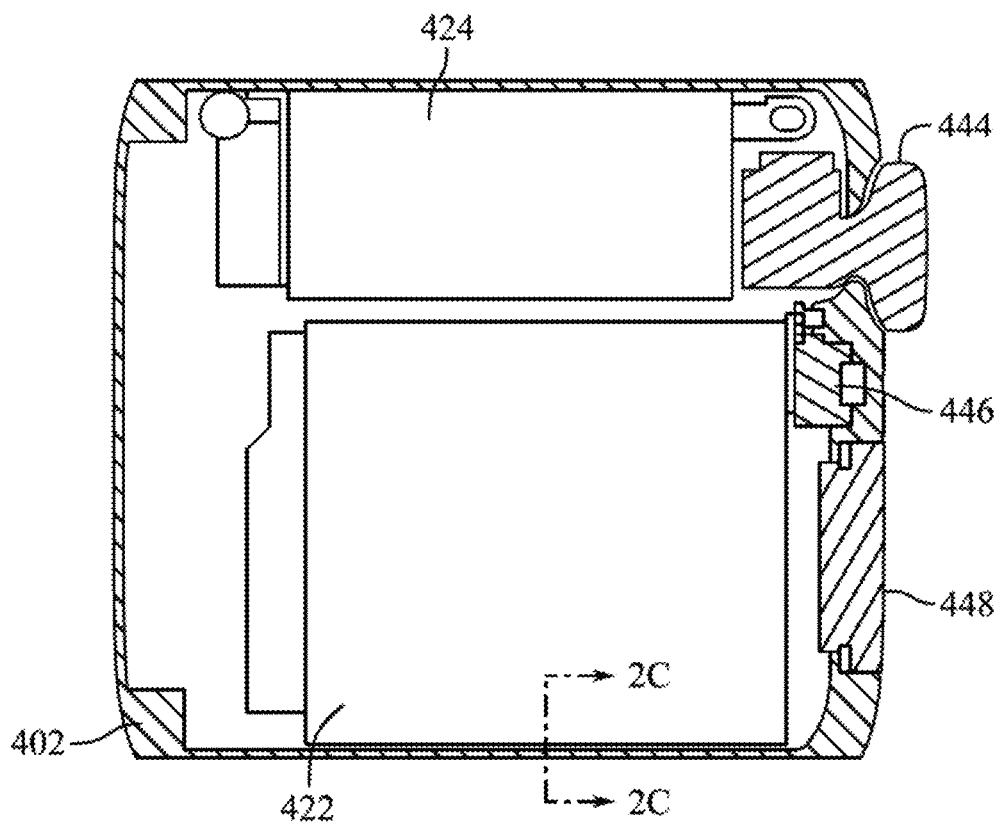
FIG. 2A shows a top cross-sectional top view of an electronic device.

FIG. 2A shows a top cross-sectional view of an electronic device that can be substantially similar to, and can include some or all of the features of the electronic devices described herein. In some examples, a housing 402 can define an internal volume with components contained therein. Several components have been omitted for simplicity, but the housing 402 can contain a battery 422 and a haptic feedback module 424 positioned near or adjacent to the battery 422. Other components of the device can also be positioned near the battery, such as a crown 444, a microphone module 446, and a button 448.

In order to maximize the size of the battery 422, and thus maximize the performance of the device, it can be desirable to have as large a battery as possible and to arrange the components of the device to allow for a relatively large battery volume. In some examples, the battery 422 is rechargeable. In some examples, the battery can be greater than about 240 milliamp hours (mAh), greater than about 250 mAh, greater than about 260 mAh, greater than about 270 mAh, or greater than about 280 mAh, or more. The battery 422 can be any type of battery desired, such as a lithium-ion battery, lithium polymer battery, metal-air battery, nickel-containing battery, or any form of battery developed in the future.

Further, the position of the battery 422 and the volume or space between the battery and adjacent components can influence the performance of one or more antennas of the device. In some examples, a distance between the exterior of the battery 422 and an adjacent component can be at least about 0.3 mm, at least about 0.4 mm, at least about 0.5 mm, or at least about 0.6 mm. Accordingly, the battery can be fixed in a desired location by one or more components. For example, the battery 422 can be fixed to the housing 402 or another component of the device by adhesives, such as pressure sensitive adhesives, by fixtures such as screws that can mate with or pass through features defined by a flange located on the battery 422. Further, the location of the battery 422 can be fixed with the use of brackets, shims, foams, or combinations thereof.

Figure 2B:
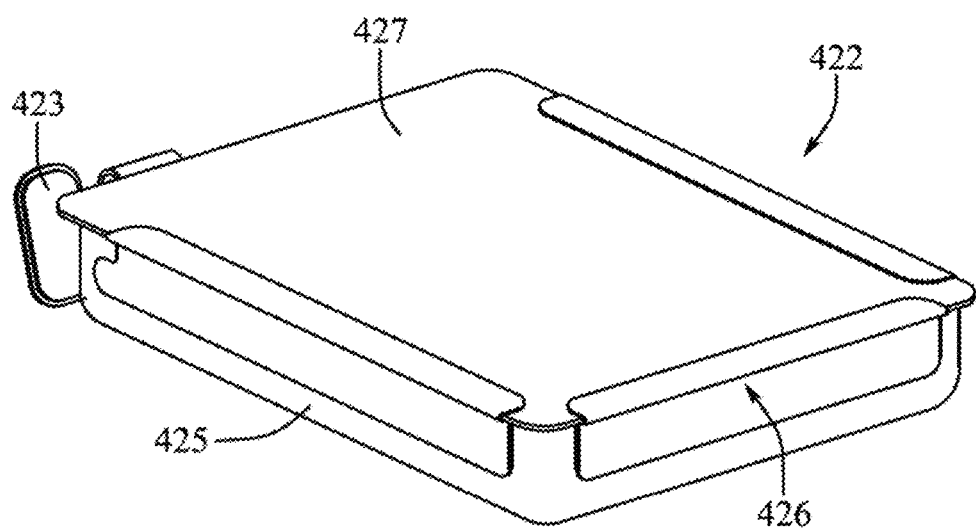
FIG. 2B shows a perspective view of a battery of the electronic device of FIG. 2A.

FIG. 2B shows a perspective view of the battery 422 including a battery housing that includes a top portion or wall 427, a bottom portion or wall (now shown), and sidewalls 425. The top portion 427 can overhang the sidewalls 425 at one or more locations to define a flange or a shelf 426 that can protrude at least partially beyond a plane defined by a sidewall. The battery 422 can also include one or more operational or electronic components, such as a processor or a controller, a printed circuit board, and the like, that can regulate the power flow between the battery 422 and other components of the device. In some examples, the electronic components of the battery 422 can be overmolded or encased with a polymeric material to form a system in package (SiP) 423 that is in electrical communication with the battery 422. The overmold material can serve to support the components on a printed circuit board and can reduce the amount of stress experienced by solder joints between the components and the board, thereby requiring a smaller amount of solder to achieve a reliable electrical connection. Accordingly, a battery 422 including a SiP 423 including a processor can have a smaller overall size while maintaining the same electrical capacity as a traditional battery.

Figure 2C:
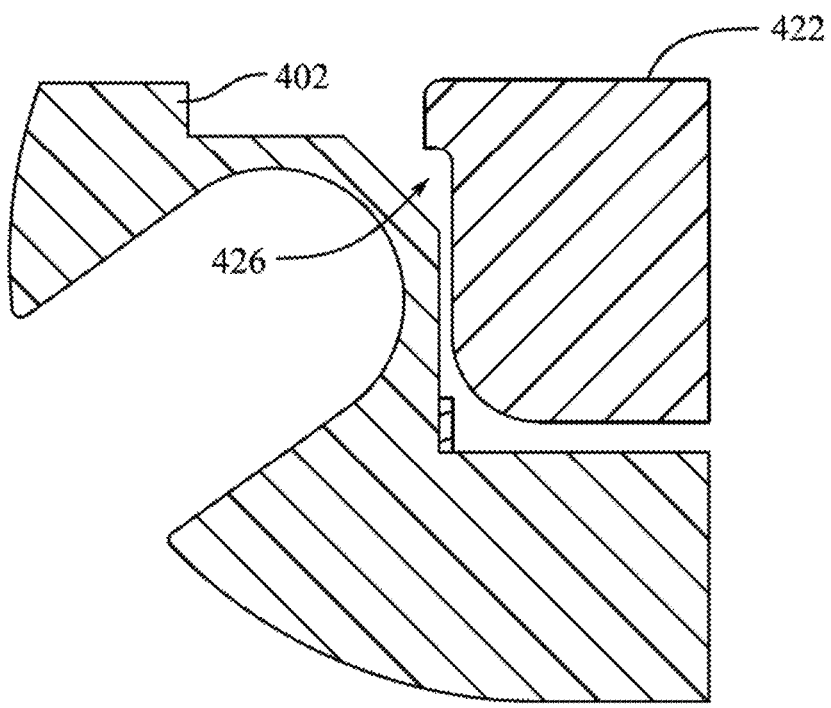
FIG. 2C shows a cross-sectional view of the electronic device of FIG. 2A.

FIG. 2C shows a cross-sectional view of the electronic device of FIG. 2A, showing the battery 422 positioned adjacent to the housing 402, with the flange 426 of the battery protruding over a portion of a sidewall of the housing 402 that at least partially defines the internal volume of the device. In this way, the shape of the battery 422 can be contoured to the housing 402 and/or any available volume within the housing to provide a battery 422 having as large a volume as desired without requiring significant modifications to the architecture or design of the device or its components. Additionally, as shown, the transitions between portions of the exterior of the battery 422 can be substantially curved.

Figure 2D:
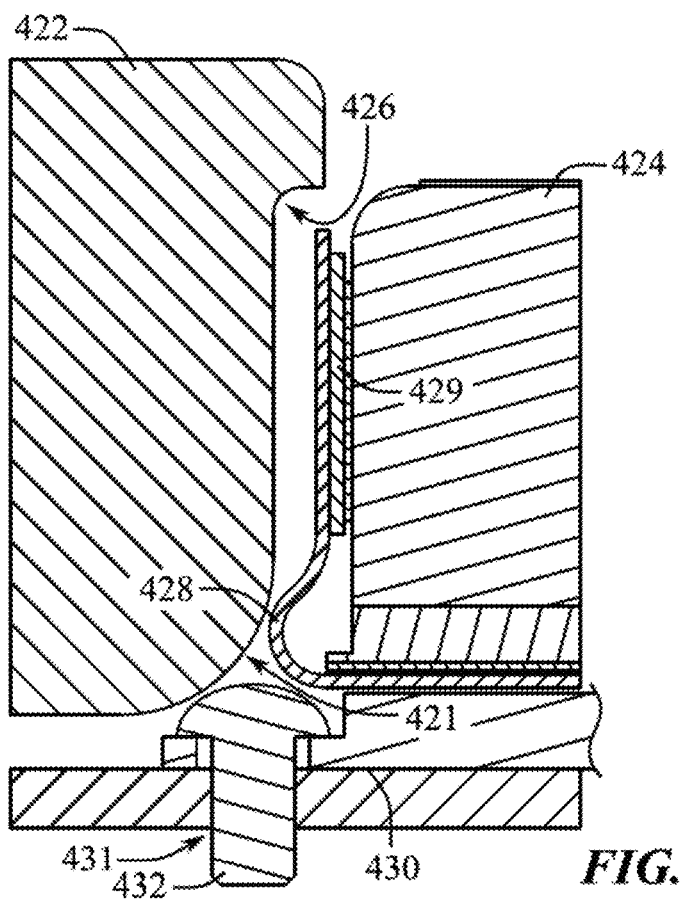
FIG. 2D shows a side view of a components of the electronic device of FIG. 2A.

FIG. 2D shows a side view of the battery 422 and the adjacent haptic feedback module 424. As can be seen, the height of the flange 426 of the battery 422 can correspond to the height of the haptic feedback module 424 in order to maximize the available volume of the battery 422. Further, portions of the haptic feedback module 424, such as electronic components and/or flexible electrical connectors 429 can be sized, shaped, and positioned to fit below the flange 426 of the battery in order to enable the battery 422 to be positioned relatively close to the haptic feedback module 424 or other components, thereby allowing for a larger available battery volume, and thus, a larger available capacity.

In some examples, the haptic feedback module 424 can be secured or affixed to the housing or other structure by a bracket 430. In some examples, the bracket 430 can define one or features to receive one or more retention components 432. In some examples, a retention component 432 can pass through an aperture defined by the bracket 430 to be received and/or retained by a corresponding retention feature 431 defined by the housing or another structural component of the device. In some examples, the retention component 432 can comprise a screw, bolt, or rivet. In some examples, the retention component 432 can define threads and the retention feature 431 can define corresponding threads.

In some examples, the bracket 430 can be secured by one, two, three, four, or even more retention components 432. For example, the bracket 430 can be secured by two retention components 432. In some examples, the retention components 432 can be disposed at a single end or region of the bracket 430 so that the bracket 403 is cantilevered.

In some examples, one or more of the retention components 432 can be at least partially disposed below at least a portion of the battery 422. This design can allow for the haptic feedback module 424 to be securely fastened to the device with a bracket 430 while still allowing for the haptic feedback module 424 to be positioned close or adjacent to the battery 422. For example, the battery 422 can define a curved region or edge 421 and the retention component 432 can be positioned below and/or adjacent to the curved region 421. In some examples, the curved region 421 can have a two-dimensional curvature or a three-dimensional curvature. In some examples, the retention component 432 can have a top portion that defines a curved surface. In some examples, the curved surface of the retention component 432 can allow for the retention component 432 to be nested or positioned at least partially below the battery 422, such as below the curved region 421. Further details of a haptic feedback module are described below with reference to FIGS. 3A and 3B.

Figure 3A:
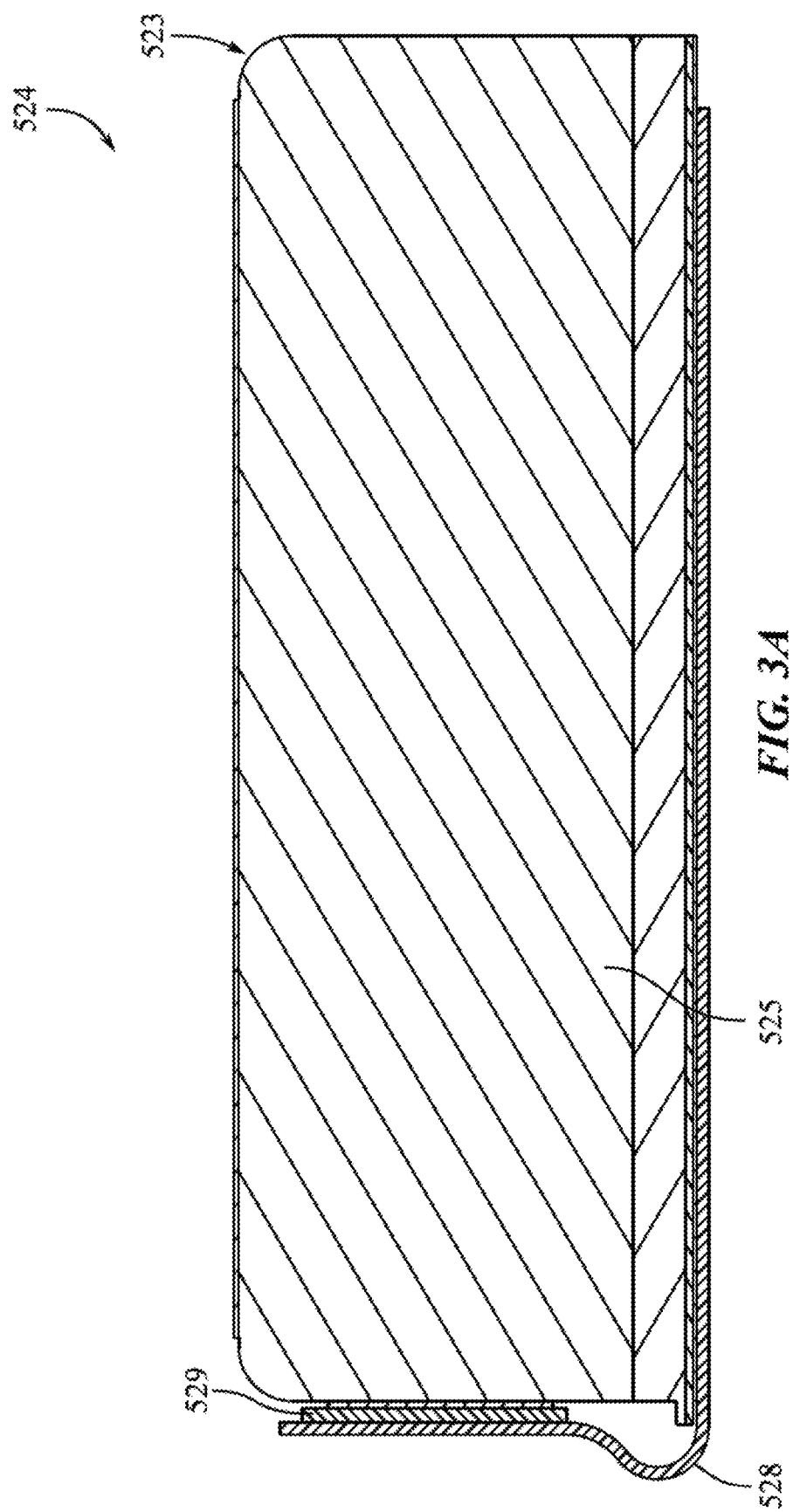
FIG. 3A shows a side view of a component of an electronic device.

FIG. 3A shows a side view of a haptic feedback module 524 that can be substantially similar to, and can include some or all of the features of the components described herein, such as haptic feedback module 424. As can be seen, the haptic feedback module 524 can include a housing or an enclosure 525 that can at least partially define a module volume and an internal volume housing parts or components of the haptic feedback module 524, such as a translatable mass, and an actuator or motor for translating the mass, for example, in a linear manner. The enclosure 525 can have a substantially rectangular or rectangular prismatic shape, although the enclosure 525 can be substantially any desired shape. In some examples, a transition between a top surface of the enclosure 525 and side surfaces can be substantially curved or rounded, for example, to provide clearance for adjacent components, such as a battery, as described with reference to FIGS. 2A-2D. In some examples, the enclosure 525 can be a substantially unitary component, or can be a two-part component.

Figure 3B:
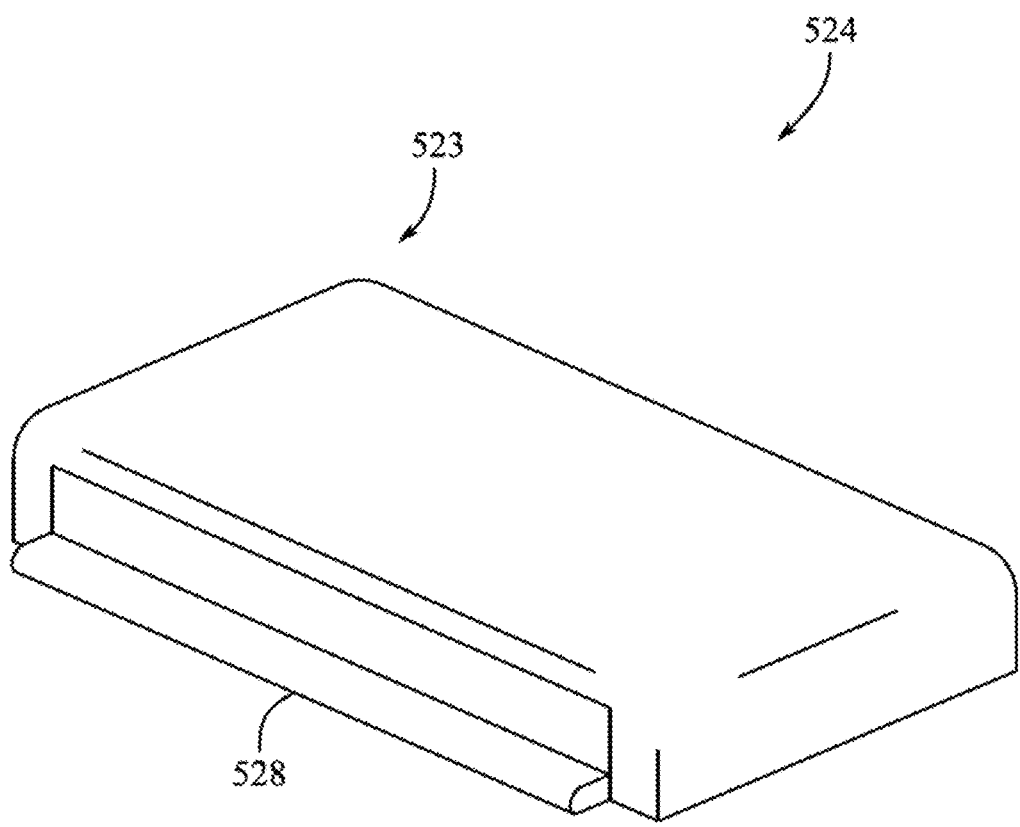
FIG. 3B shows a perspective view of the component of FIG. 3A.

The haptic feedback module 524 can also include an electrical connector 528 that can be in electrical communication with, and can provide signals to and from, other components of the device. In some examples, the flexible connector 528 can be attached to a connection portion 529. In some examples, the bend radius of the flexible electrical connector 528 can be selected to have a relatively small radius of curvature and to allow the haptic feedback module 524 to be positioned near or adjacent to the other components, such as a battery, or the housing of the device. FIG. 3B shows a perspective view of the haptic feedback module 524, including the rounded transitions 523 from the top portion of the enclosure 525 to the side portions, as well as the location of the flexible connector 528.

Any number or variety of components in any of the configurations described herein can be included in an electronic device as described herein. The components can include any combination of the features described herein and can be arranged in any of the various configurations described herein. The structure and arrangement of components of a device, as well as the concepts regarding can apply not only to the specific examples discussed herein, but to any number of embodiments in any combination. Various examples of electronic devices and electronic device components including those having various features in various arrangements are described below, with reference to FIGS. 4A-5C.

Figure 4A:
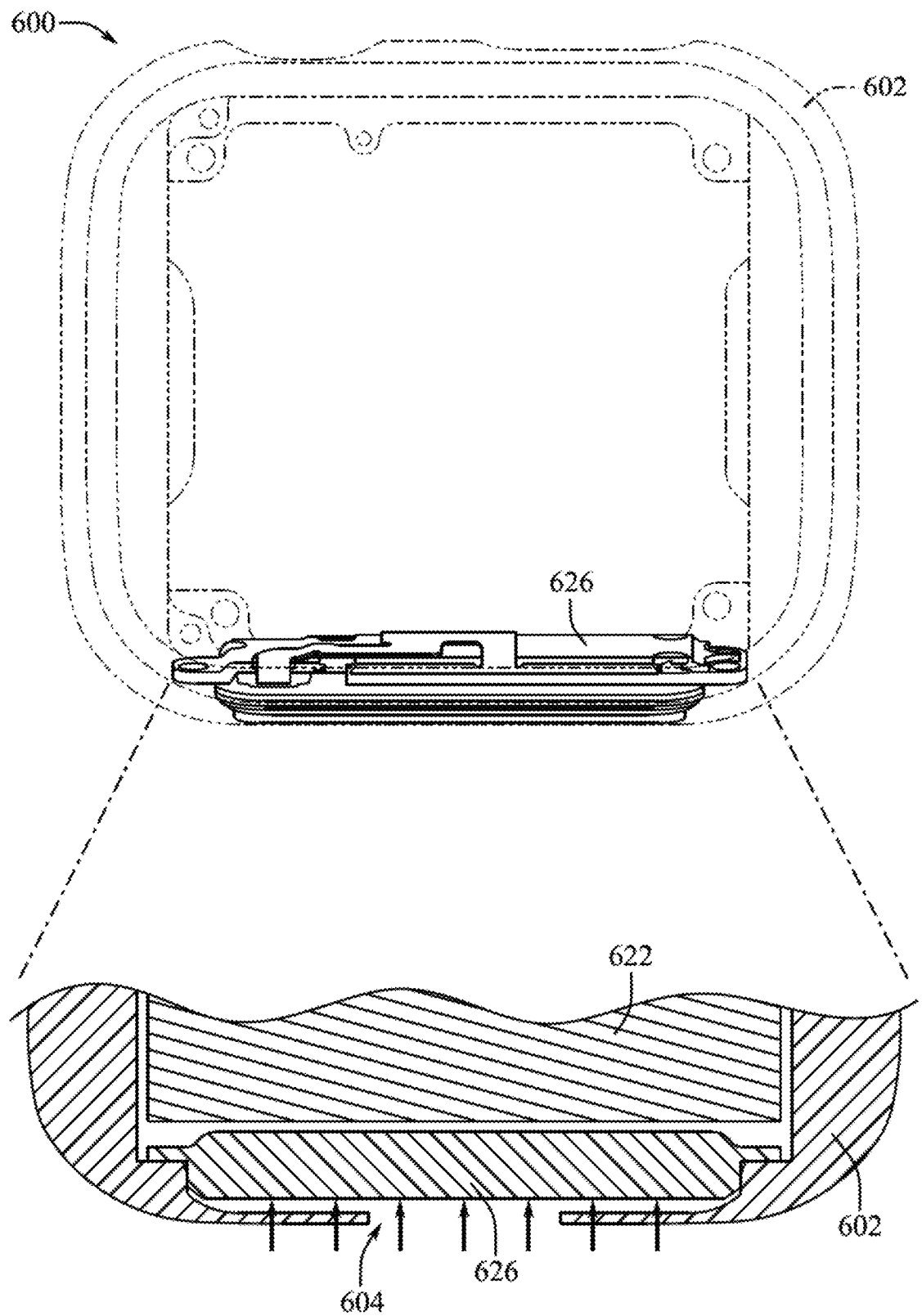
FIG. 4A shows top and close-up views of a portion of an electronic device.

FIG. 4A shows partial top view of an electronic device 600 that can be substantially similar to, and can include some or all of the features of, the devices described herein, such as device 300. The device 600 can include a housing 602 that can at least partially define an exterior surface and an internal volume of the device. The housing 602 can also define one or more apertures 604 that can be in communication with a portion of the internal volume and the ambient environment.

As shown, one or more components or modules can be disposed at the aperture 604, such as a speaker module 626 that can be in communication with the ambient environment, and that can also act as a seal or a barrier between the ambient environment and the internal volume. In some example situations, such as when the device 600 is submerged in water, the relatively large area of the speaker module 626 that is exposed to the environment can be subjected to relatively high amounts of water pressure, shown as arrows in FIG. 4A. That is, immersion of the device 600 in water, or other environments, can result in a high load or force being applied to the speaker module 626. Accordingly, it can be desirable for the speaker module 626 to have a high level of stiffness to resist deformation or flexure in response to this force in order to maintain a barrier or seal and prevent ingress of the water or environmental contaminants into the internal volume. Further, because the speaker module 626 is disposed in the internal volume, it can be desirable for the speaker module 626 to be as thin as possible in order to maximize the area or volume available for other components, such as a battery 622.

Figure 4B:
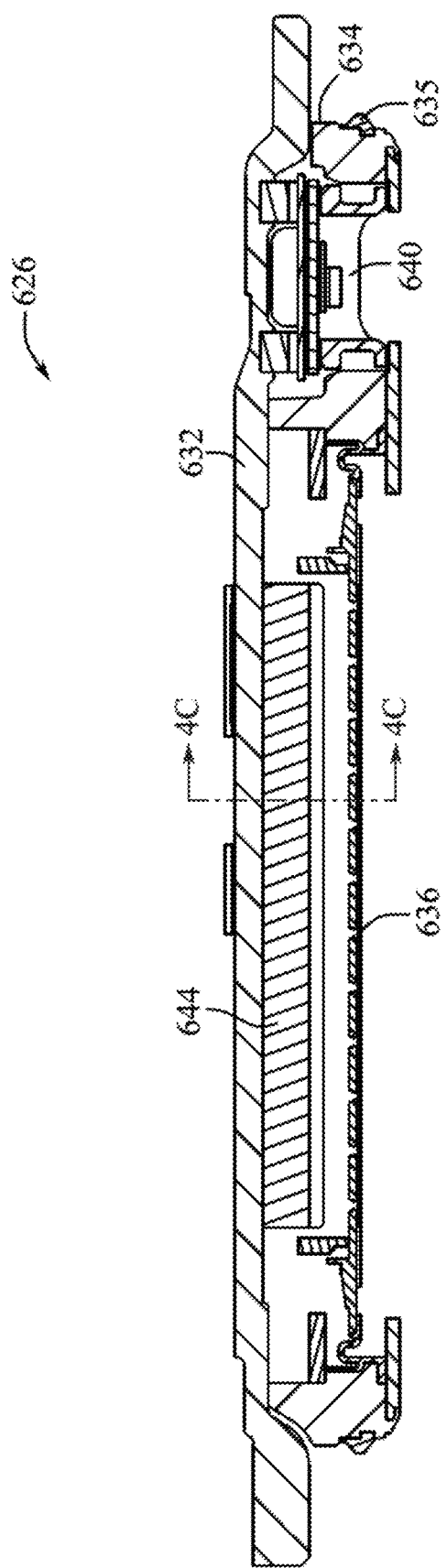
FIG. 4B shows a top view of a component of the electronic device of FIG. 4A.

FIG. 4B shows a top cross-sectional view of the speaker module 626 shown in FIG. 4A. The speaker module 626 can include a housing or enclosure 634, a seal or gasket 635, a membrane or diaphragm 636, and an integrated acoustic and support component 632 that can be involved in driving the diaphragm 636 to produce acoustic signals or sounds, as well as providing stiffness and structural support to the speaker module 626. The speaker module 626 can further include one or more other operational components or sensors, for example that may have a reason to communicate with the ambient environment. In some examples, the speaker module 626 can also include a pressure sensor module 640. In some examples, the gasket 635 can contact one or more surfaces of the housing 602 to define a seal between the ambient environment and the internal volume defined by the housing 602.

Figure 4C:
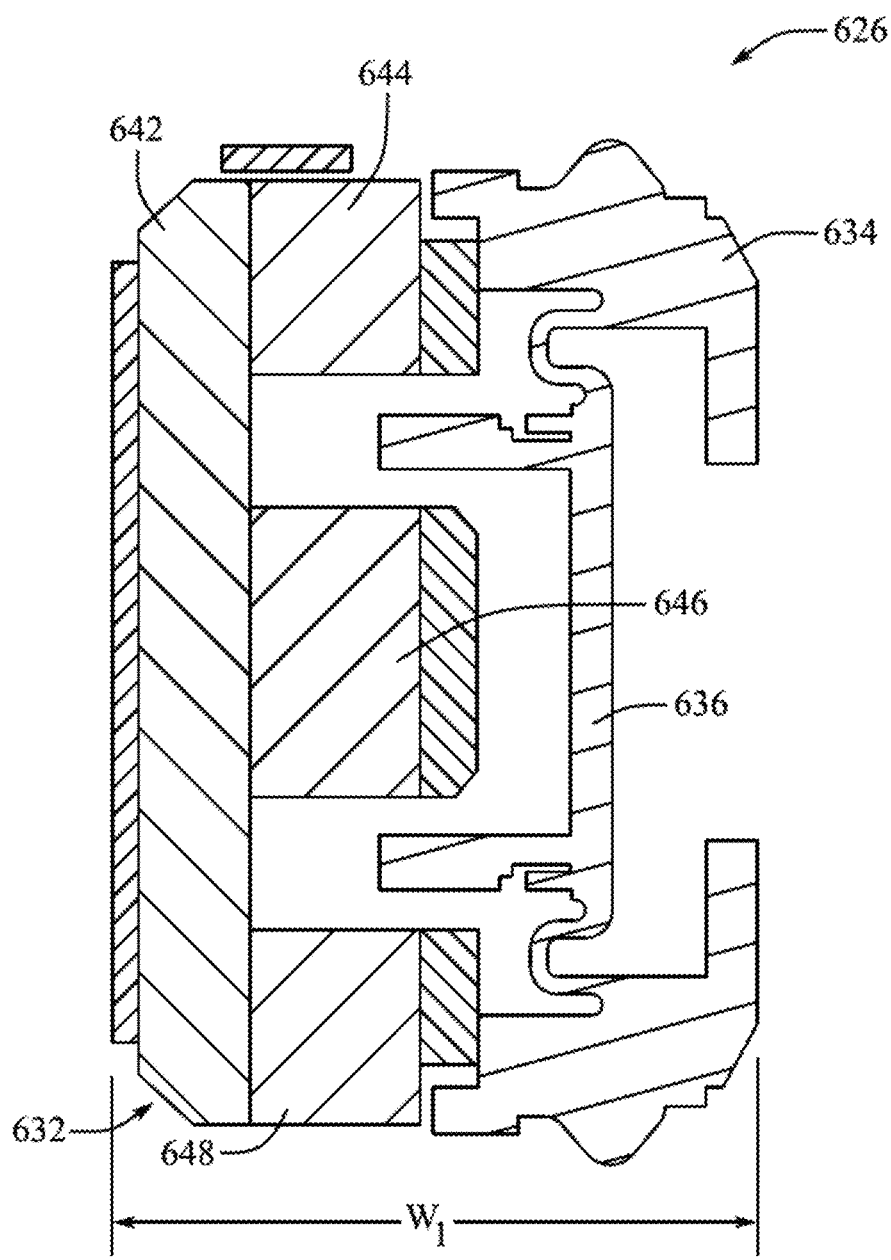
FIG. 4C shows a cross-sectional view of the component of the electronic device of FIG. 4A.

FIG. 4C shows a cross-sectional view of the speaker module 626 taken along the line shown in FIG. 4B. As seen, the speaker module 626 can include an enclosure 634 that can include attachment features for affixing the speaker module 626 to the housing 602, and that can further seal against the housing 602 to provide a barrier to the ingress or liquid or contaminants into the internal volume of the housing 602. The speaker module 626 also includes an integrated acoustic and support component 632. This component can include a support member 642 that can provide structural support to the speaker module 626 to substantially prevent flexure or deformation of the module 626 under applied loads. The support member 642 can include a metallic material, such as steel. In some examples, the support member 642 can include a stainless steel alloy, such as 316 stainless steel or 17-4 stainless steel.

In some examples, the support member 642 can be formed by any combination of additive and/or subtractive manufacturing processes. For example, the support member 642 can be a metal injection molded (MIM) part. In some examples, the support member can also be subjected to one or more processes to achieve a desired level of flatness. For example, a MIM support member 642 can be restruck in a stamping process to achieve a desired level of flatness. In some examples, the support member 642 can have a flatness of less than about 0.05, less than about 0.04, or even less than about 0.03 or smaller. Further, the speaker module 626 can have a width $W_1$ that is less than about 4 mm, less than about 3.5 mm, less than about 3.2 mm, or less than about 3.1 mm or smaller. As used herein, the term flatness can refer to the separation distance between two imaginary parallel planes that bound the uppermost and lowermost points of the surface being measured.

The acoustic and support component 632 can further include one or more magnets, such as magnets 644, 646, and 648 that are affixed or bonded directly to the support member 642. In some examples, the magnets 644, 646, 648 can be bonded to the support member 642 by any desired method, such as welding, brazing, an adhesive, or combinations thereof. The magnets 644, 646, 648 can be used to drive the diaphragm 636 to produce acoustic signals or sounds. The magnets 644, 646, 648 can include any desired magnetic material and can be permanent, semi-permanent, or electromagnets, as desired. The acoustic and support component 632 can further include a ring or a plate 645 that can also be bonded or affixed to the magnets 644, 646, 648, for example, in the same or a similar manner as the support member 642. The ring 645 can include any desired material, such as polymeric and/or metallic materials, including steel. The ring 645 can then be affixed to the enclosure 634, as desired. Accordingly, in some examples, the integrated acoustic and support component 632 can provide sufficient stiffness and robustness to the speaker module 626 to provide water resistance for the device 600 to a depth of at least about 25 m, at least about 50 m, or at least about 75 m or more.

Figure 4D:
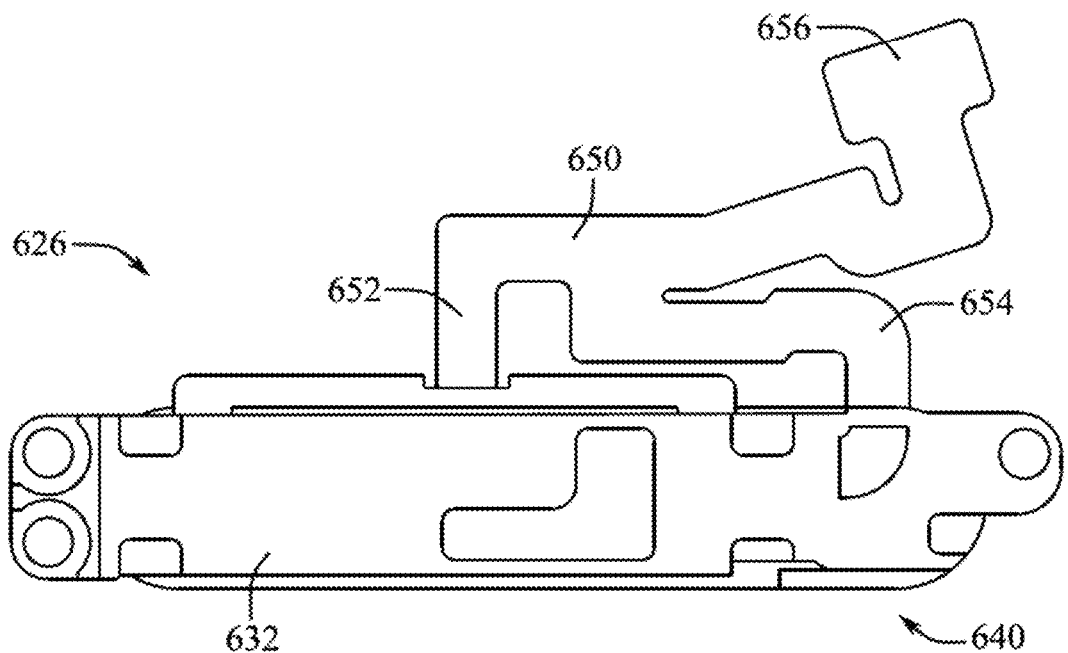
FIG. 4D shows a top view of the component of the electronic device of FIG. 4A.

FIG. 4D shows a rear view of the speaker module 626 including an integrated acoustic and support component 632. An operational component, such as a pressure sensor 640 (obscured by the acoustic and support component 632 in this view) can be mounted to the acoustic and support component 632. Both the pressure sensor 640 and components of the speaker module 626, such as the magnets and/or driving components can be in electrical communication with other components of the device 600, such as one or more processors, through an integrated flexible connector 650. That is, a single flexible connector 650 can include a first portion 652 in communication with speaker components, and a second portion 654 in communication with the sensor 640. These portions can be connected to a single connection point 656 that can be in communication with other components in the device 600.

Figure 4E:
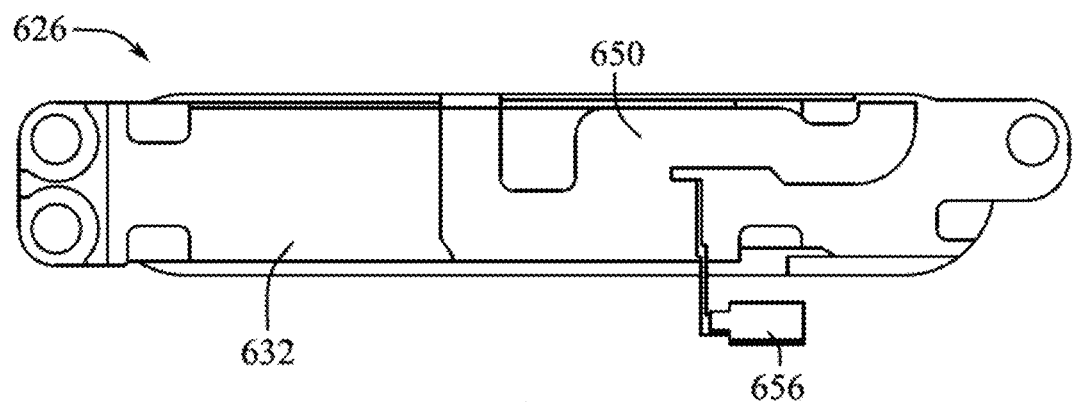
FIG. 4E shows a top view of the component of the electronic device of FIG. 4A in an alternative configuration.

FIG. 4E shows a rear view of the speaker module 626 including the integrated flexible connector 650 folded around the acoustic and structural component 632 in a configuration as would be desired when the speaker module is assembled into the device 600. As can be seen, the flexible connector 650, or portions thereof, can lay substantially flat against the acoustic and structural component 632 to save space and to provide the connection point 656 in a desired orientation and location for connection to other components of the device 600. Further details of additional audio components are provided with respect to FIGS. 5A-C.

Figure 5A:
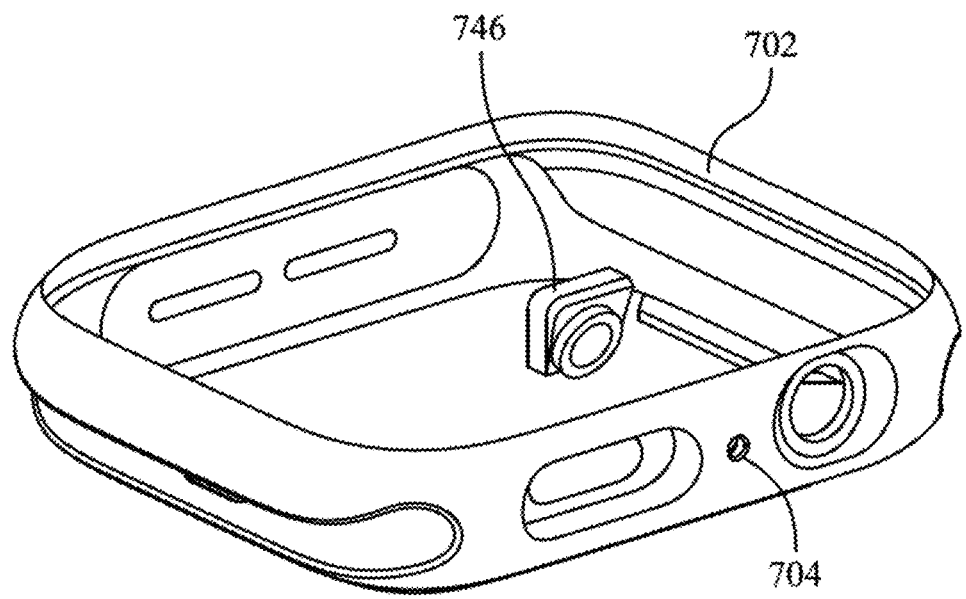
FIG. 5A shows an exploded view of a portion of an electronic device.

FIG. 5A shows an exploded view of a portion of an electronic device 700 that can be substantially similar to and can include some or all of the features of the device described herein. The device 700 can include a housing 702 that can at least partially define an exterior surface and an internal volume of the device 700. The housing 702 can also define one or more apertures 704 that can be in communication with a portion of the internal volume and the ambient environment.

As shown, one or more components or modules can be disposed at the aperture 704, such as a microphone module 746, that can be in communication with the ambient environment, and that can also act as a seal or barrier between the ambient environment and the internal volume.

FIG. 5B shows a cross-sectional view of the electronic device 700 including the housing 702 and the microphone module 746 sealed to the housing 702 inside a recess or a cavity. In some examples, by designing the microphone module 746 and housing 702 such that a relatively large volume of the microphone module 746 is disposed within the cavity defined by a wall of the housing, additional space in the internal volume defined by the housing 702 can be freed up for use by other components or for a reduction in device 700 size. Further, it can be desirable to provide a microphone module 746 that is as thin as possible for these same reasons.

In some examples, the microphone module includes an enclosure 750 that can include any desired material, such as polymeric materials or plastics. The enclosure can retain the other components of the microphone module 746 which can be affixed thereto. In some examples, a seal 754 can be affixed, bonded, or otherwise secured to the enclosure 750. The seal 754 can include a compliant material, such as a polymeric material like rubber or plastic. In some examples, the seal 754 can include silicone rubber. In some examples, the seal 754 can be overmolded onto the enclosure 750 and can directly contact the enclosure and the housing 702 to provide a seal or barrier between the ambient environment and the internal volume of the device 700.

The microphone module 746 can further include a grill 752 that can be positioned at or near the aperture 704. The grill 752 can be secured to the enclosure 750 and can act as a physical barrier to prevent objects, such as dust or rocks, from entering the aperture 704 and damaging the microphone module 746. The grill 752 can be permeable to air or liquid, and acoustic signals can pass therethrough to the membrane or diaphragm 758. The diaphragm can be coupled to one or more electronic components 756 that can convert the movement of the diaphragm in response to acoustic signals into electrical signals that can be communicated to other components of the device 700 through an electrical connector 760.

FIG. 5C shows an exploded view of portions of the microphone module 746, including the seal 754, the enclosure 750 that defines an aperture, the air or liquid permeable grill 752 that can be affixed to the enclosure 750 at or over the aperture, and the diaphragm 758 that can be affixed or secured to the enclosure 750 by an adhesive 757, such as a pressure sensitive adhesive.

Any number or variety of components in any of the configurations described herein can be included in an electronic device, as described herein. The components can include any combination of the features described herein and can be arranged in any of the various configurations described herein. The structure and arrangement of components of a device, as well as the concepts regarding its use can apply not only to the specific examples discussed herein, but to any number of embodiments in any combination. Various examples of electronic devices and electronic device input components including those having various features in various arrangements are described below, with reference to FIGS. 6A-6D.

Figure 6A:
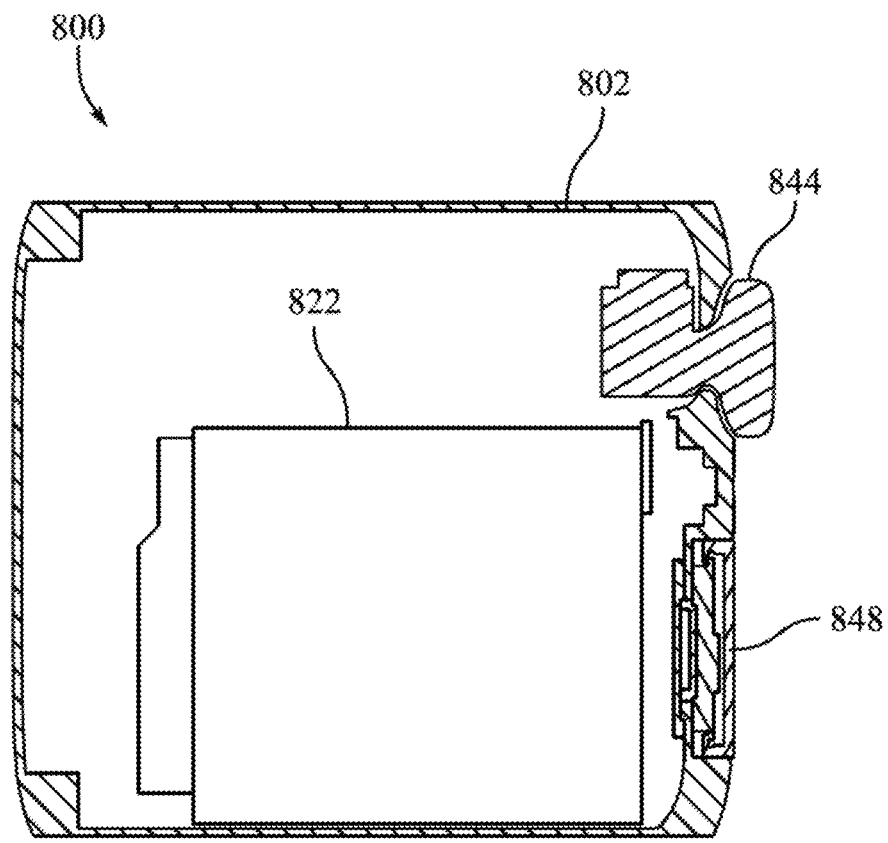
FIG. 6A shows a top cross-sectional view of an electronic device.

FIG. 6A shows a top cross-sectional view of an electronic device 800 that can be substantially similar to, and can include some or all of the features of the electronic devices described herein. In some examples, a housing 802 can define an internal volume with components contained therein. Several components have been omitted for simplicity, but the housing 802 can contain a battery 822, as well as various input components, such as a crown 844, and a button 848. It can be desirable for these modules to be as small and as thin as possible, while still providing a desired level of functionality, in order to allow room for other components, such as the battery 822 to occupy the internal volume or to reduce the size of the internal volume, and thus the overall size of the device 800.

Figure 6B:
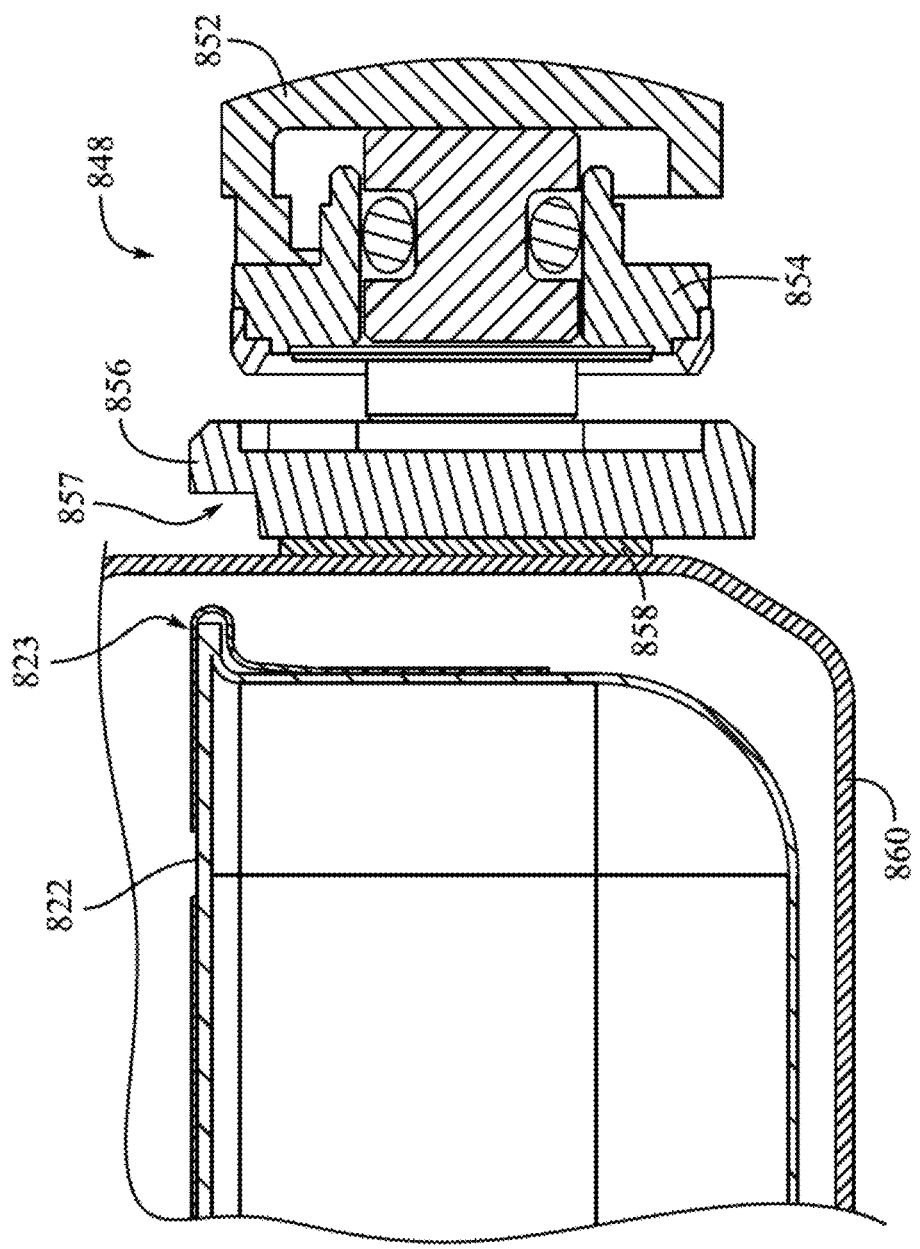
FIG. 6B shows a cross-sectional view of a portion of the electronic device of FIG. 6A.

FIG. 6B shows a cross-sectional view of a portion of the device 800 including the battery 822 and the button module 848. As described with respect to the battery 422, the battery 822 can include a top portion that overhangs and extends past a sidewall to define a flange or shelf 823 that can allow for additional battery capacity. The button module 848 can include a bracket 856 that can secure the button module 848 to the housing (not shown). An input portion 852 of the button module 848 can define an exterior surface of the module 848 and can protrude at least partially through an aperture defined by the housing to partially define an exterior surface of the device 800. The input portion 852 can be coupled to the bracket 856 through a mechanism 854 that can allow the button 848 to be actuated by a user, for example, by depressing the input portion 852 with an extremity.

In some examples, the bracket 856 can define a groove 857 that can be positioned in line with the flange 823 of the battery 822. Further, a flexible electrical connector 860 that can provide electrical communication between other components of the device 800, such as a display and a processor, can be routed to pass over the bracket 856. In some examples, the flexible connector 860 can be secured to the bracket 856, for example, by an adhesive 858, such as a pressure sensitive adhesive, to maintain a desired position of the flexible connector 860. The retention of the flexible connector 860 in this desired location can boost or assist with the performance and/or tuning of one or more antennas of the device 800.

Additionally, during a drop event or the exertion of a high force on the device 800, the battery 822 can shift or move slightly relative to the housing 802 and the bracket 856. The groove 857 is positioned and sized such that any such shift of the battery 822 will cause the flange 823 to merely deflect the flexible connector 860 into the groove 857, rather than compressing the flexible connector 860 between the flange 823 and the bracket 856, potentially causing damage. As such, the architecture of the bracket 856 and battery 822 can provide for increased reliability in the device 800.

Figure 6C:
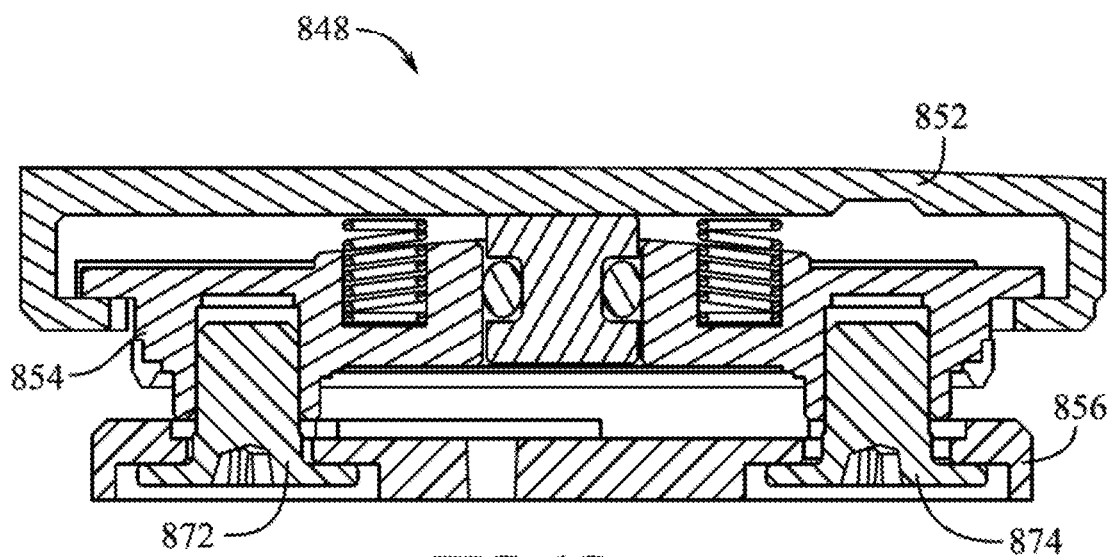
FIG. 6C shows a cross-sectional view of a component of the electronic device of FIG. 6A.
Figure 6D:
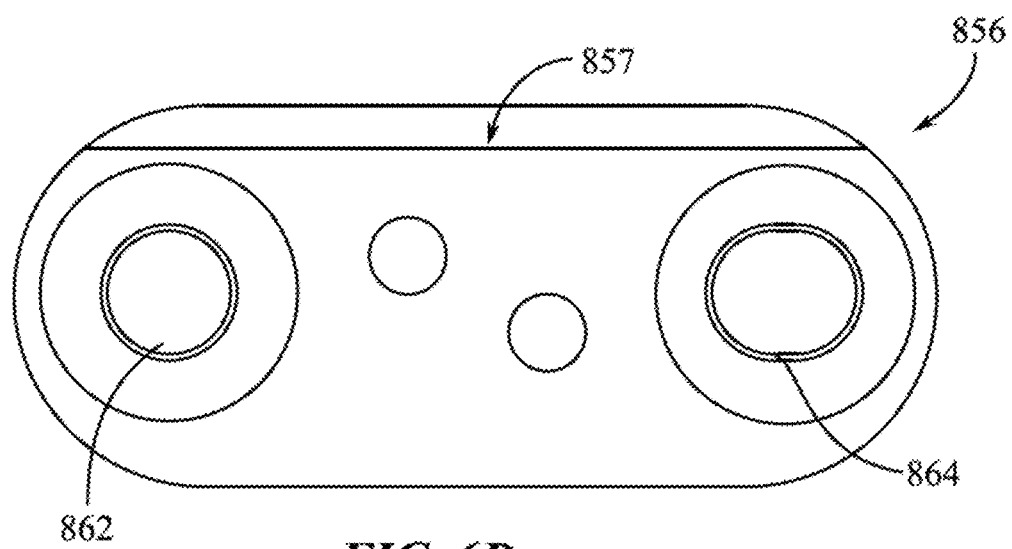
FIG. 6D shows a rear view of the component of the electronic device of FIG. 6A.

FIG. 6C shows a top cross-sectional view of the button module 848, including the input portion 852 coupled to the mechanism 854 and the bracket 856. As shown, the bracket can define one or more retention features that can receive and retain one or more retention components, such as screws 872, 874. FIG. 6D shows a rear view of the bracket 856, including the retention features, here apertures 862, 864, that are sized and shaped to receive the retention components 872, 874, respectively, to retain the input portion 852 and mechanism 854 on the bracket 856.

Any number or variety of components in any of the configurations described herein can be included in an electronic device, as described herein. The components can include any combination of the features described herein and can be arranged in any of the various configurations described herein. The structure and arrangement of components of a device, as well as the concepts regarding the use and functionality thereof can apply not only to the specific examples discussed herein, but to any number of embodiments in any combination. Various examples of electronic devices and electronic device antenna and display components including having various features in various arrangements are described below, with reference to FIGS. 7A-9.

Figure 7A:
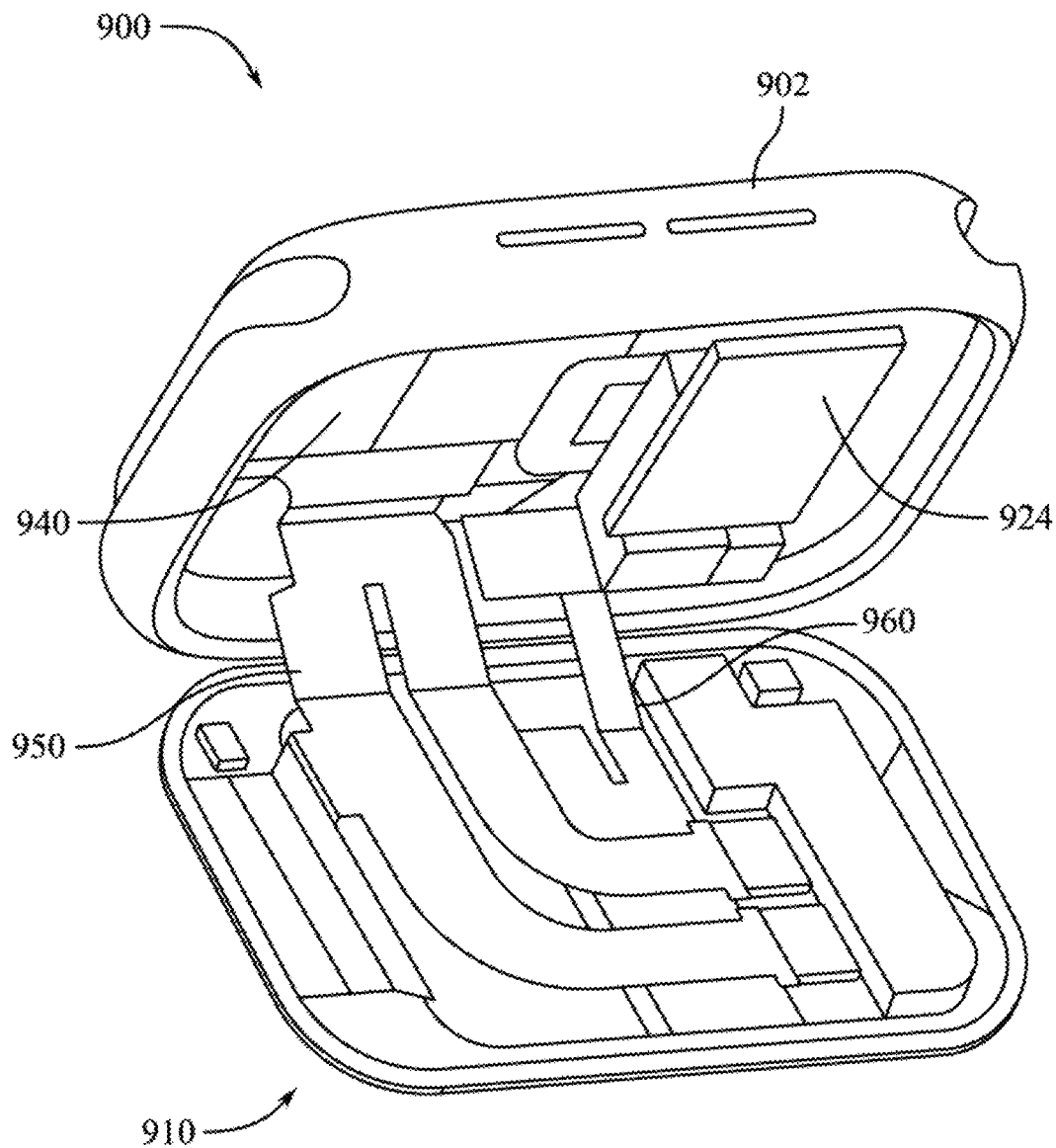
FIG. 7A shows a partially unassembled view of an electronic device.

FIG. 7A shows a partially unassembled view of an electronic device 900 that can be substantially similar to, and can include some or all of the features of, the electronic devices described herein, such as devices 200, 300. The device 900 is shown in the same orientation as the device 200 as illustrated in FIG. 1C, with the display assembly 910 partially removed from the housing 902. Several components of the device 900 are not shown for simplicity, but the device 900 can include a main logic board 940 including one or more processors and memory, a haptic module 924, and flexible electrical connectors 950 that can provide electrical coupling, and transmit power and/or signals, between the logic board 940 and the display assembly 910. The device 900 can also include a conductive component 960 that can electrically couple the display assembly 910 to other portions or components of the device, for example to provide electrical grounding.

Additionally, as can be seen in FIG. 7A, in some example the flexible electrical connectors 950 and the conductive component 960 can be positioned such that they extend from a same side or region of the display assembly 910. In some examples, the flexible electrical connectors 950 and the conductive component 960 can thus also extend from the display assembly 910 into the portion of the internal volume defined by the housing 902 along a same side or region of the housing 902, whereupon the flexible electrical connectors 950 and the conductive component 960 can be coupled to one or more other components as desired. Accordingly, in some examples, all or substantially all of the electrical connectors, such as components 950, 960, extending between the display assembly 910 and any other components disposed in the portion of internal volume of the device 900 defined by the housing 902 can be positioned along a same side of the housing 902 and display assembly 910. That is, where the device 900 comprises a housing 902 having multiple sidewalls, the flexible electrical connectors 950 and the conductive component 960 can be disposed adjacent to only a single sidewall.

In some examples, this configuration, where the electrical connections between the display assembly 910 and the other components of the device 900 are aligned along a single side, can allow for the device 900 to include antennas having higher bandwidths than might be efficiently achieved using other connector configurations. In some examples, the ability to efficiently radiate and receive signals at high bandwidths can be at least partially due to the ability to radiate and/or receive signals from all or substantially all of the other sides or regions of the housing 902 that are not adjacent to the flexible electrical connectors 950 and the conductive component 960. In some examples, this configuration of the flexible electrical connectors 950 and the conductive component 960 can enable the device 900 to include one or more antennas that operate at frequencies up to about 2000 MHz, up to about 2700 MHz, up to about 3000 MHz, up to about 5000 MHz, up to about 7500 MHz, up to about 8000 MHz, up to about 8.25 MHz, or up to about 8500 MHz or even higher.

Figure 7B:
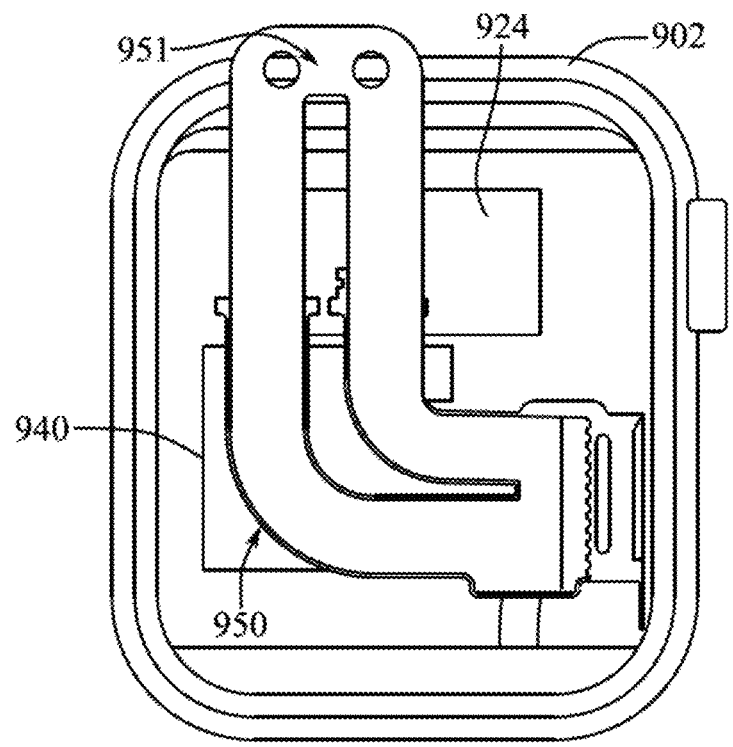
FIG. 7B shows a top view of a portion of the electronic device of FIG. 7A.

FIG. 7B shows a top view of a portion of the electronic device 900. The device 900 is shown at a stage of the assembly process, whereby the display assembly 910 has yet to be attached to the flexible electrical connector 950. At this stage, the flexible electrical connector 950 can be coupled or attached to components of the device 900, but can include a releasable liner 951 that can serve to protect one or more regions comprising conductive and/or adhesive material that are disposed on the flexible electrical connector 950 as will be described with respect to FIG. 7C. In some examples, this releasable liner 951 can comprise a polymer material. In some examples, the releasable liner 951 can comprise a single or continuous portion of material that can be used to protect both portions of the connector 950 as described herein.

As can be seen, the flexible electrical connector 950 can include a first end that connects to the logic board 940, for example, at a connection point, and a second end that can pass through one or more apertures defined by the housing 902, whereupon additional connection points can be connected to the display assembly (not shown). In some examples, the flexible electrical connector can act as a radiating element of an antenna, and can be driven by one or more components disposed on the logic board 940 and/or the display assembly 910. In some examples, the flexible electrical connector 950 can act as a radiating element to radiate signals in the direction of the display assembly. Further, the flexible electrical connector 950 can be substantially L-shaped, or bent, and can include two portions that can be connected at the second end, but separate at the first end of the flexible electrical connector 950.

Figure 7C:
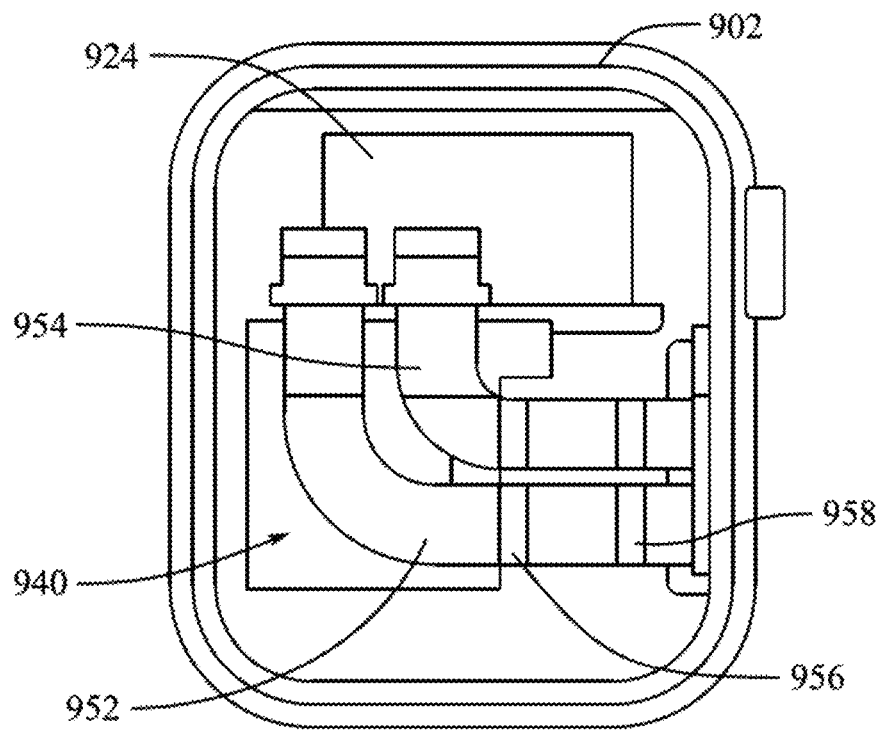
FIG. 7C shows a top view of a portion of the electronic device of FIG. 7A.

FIG. 7C shows a similar top view of a portion of the device 900 as FIG. 9B, including the flexible electrical connector 950 with the second end folded or bent upwards as it would be in an assembled configuration. As can be seen, the flexible electrical connector 950 can include a first portion 952 and a second portion 954 that can be separate, or that can be connected at one end, such as the second end. In some examples, one portion 952 can act as an electrical connector between a touch sensitive layer of the display assembly 910 and the logic board 940, while a second portion 954 can act as an electrical connector between a display layer of the display assembly 910 and the logic board 940, and/or vice versa.

In some examples, the size, width, and/or number of portions of the flexible electrical connector 950 can be reduced by locating as many components as possible on the logic board 940, for example in a SiP disposed thereon. In some examples, one or more antennas, such as a near-field communication (NFC) antenna can be located on the logic board 940, and thus may not require a flexible electrical connector to be in electrical communication with a processor on the logic board 940.

In some examples, the flexible electrical connector 950 can be electrically grounded to the display assembly (not shown), which can overlie the flexible electrical connector 950 in the orientation shown in FIG. 7C. For example, each portion 952, 954, can have sections of conductive material 956, 958 disposed thereon to provide an electrical ground path between each portion 952, 954 of the flexible electrical connector 950 and the display assembly 910. In some examples, the sections of conductive material 956, 958 can include a conductive adhesive, and/or an adhesive including conductive material. For example, the conductive material 956, 958 can include a conductive pressure sensitive adhesive. In some examples, conductive tapes or other conductive materials can be used. In some examples, the conductive material 956, 958 can have a width of about 25 microns or greater, about 50 microns or greater, about 100 microns, or greater, or more. In some examples, the conductive material 956, 958 can span an entire width of each portion 952, 954 of the flexible electrical connector 950. In some examples, the conductive material 956, 958 can have a thickness, or height above the flexible electrical connector 950 of about 50 microns or less, about 75 microns or less, about 100 microns or less, or about 125 microns or less. Although four portions of conductive material 956, 958 are shown, in some examples, any number of portions can be used.

In some examples where the conductive material 956, 958 includes an adhesive, the conductive material 956, 958 can serve to maintain a position of the flexible connector 950 against the display assembly 910 in a desired portion. In some cases where the display assembly 910 can include an antenna, as described herein, the retention of the flexible electrical connector 950 in a desired position against the display assembly can result in reliable and improved antenna performance. Additionally, the electrical grounding provided by the conductive material 956, 958 can allow the return of a driving signal from an antenna in communication with the flexible electrical connector 950 to the ground after passing through the flexible electrical connector 950. Further detail regarding a display assembly including one or more antennas is provided below with reference to FIGS. 8A-8D.

Figure 8A:
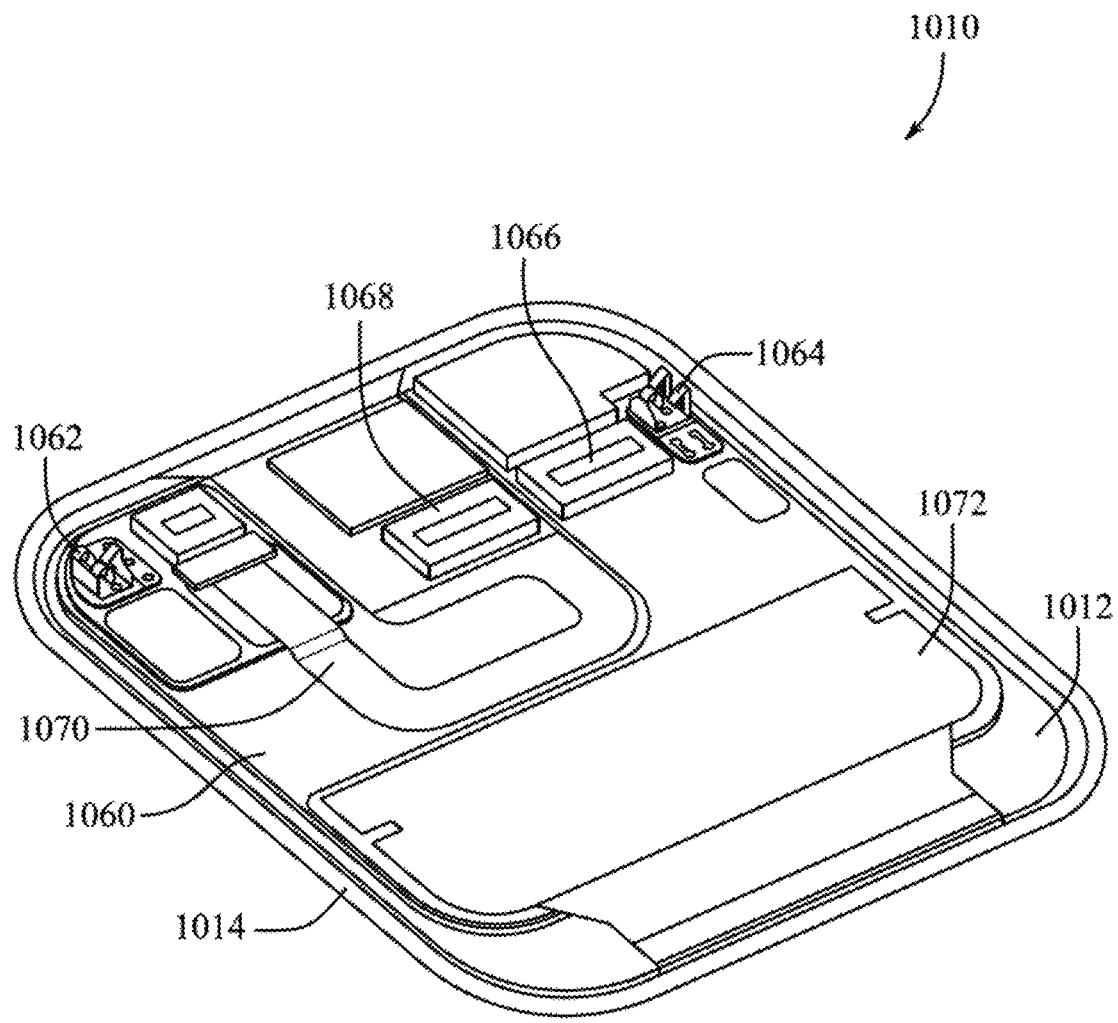
FIG. 8A shows a bottom perspective view of a portion of an electronic device.

FIG. 8A shows a bottom perspective view a display assembly 1010 that can be substantially similar to, and can include some or all of the features of the display assemblies described herein. The display assembly 1010 shown in FIG. 8A is disposed upside down relative to the display assembly 310 shown in, for example, FIG. 2A. The display assembly 1010 can include a transparent cover 1014, and a display stack 1012 that can include multiple layers and components, each of which can perform one or more desired functions. For example, the display stack 1012 can include a display layer that can include a touch detection layer or component, a force sensitive layer or component, and one or more display layers or components that can include one or more pixels and/or light emitting portions to display visual content and/or information to a user. In some examples, the display layer can include a liquid crystal display (LCD), a light emitting diode (LED) display, an organic light emitting diode (OLED) display, and/or any other form of display.

The display assembly can also include a grounding plane 1060 that can be disposed below the display stack 1012, or in the position shown in FIG. 8A, above the display stack 1012. The display assembly 1010 can also include further components that are not shown for simplicity. The grounding plane 1060 can be a sheet or plane of conductive material, such as one or more metallic materials, that can extend over substantially all of an area of the display assembly 1010. In some examples, the grounding plane 1060 can include metallic materials such as copper, silver, and/or gold. In some examples, the grounding plane 1060 can include copper and gold. For example, a copper surface that is coated with gold by any desired deposition or coating process. In some examples, the grounding plane 1060 can be disposed on and/or supported by a surface of a printed circuit board or other substantially planar surface of the display assembly 1010. In some examples, the grounding plane 1060 can be a layer of a printed circuit board of the display assembly.

In some examples, in addition to providing electrical grounding for components of the display assembly 1010, as well as other components of an electronic device including the display assembly 1010, the grounding plane 1060 can act or serve as a radiating element or body for one or more antennas in communication with the grounding plane 1060. For example, one or more LTE, Wi-Fi, ultra-wideband (UWB), and/or other antennas. By utilizing the grounding plane 1060, which is a substantially solid sheet or plane of conductive material that extends across all or substantially all of the area of the display assembly 1010, the display assembly 1010 can be treated as a relatively "solid block" of conductive material for the purposes of tuning the one or more antennas, thereby reducing the complexity of tuning procedures and increasing antenna performance and/or reliability. The display assembly 1010 can include one or more spring fingers 1062, 1064 that can be in electrical communication with the grounding plane 1060 and that can be electrically connector to other components in a device including the display assembly 1010 to provide an electrical path to the grounding plane 1060 as described further herein.

The display assembly can also include one or more electrical connection points 1066, 1068 that can be in communication with components of the display assembly 1010, such as the display stack 1012, and that can receive connection points of flexible electrical connectors, such as the flexible electrical connector 950 described with respect to FIGS. 7A-7C. The display assembly 1010 can also include one or more of its own flexible electrical connectors 1070, that provide electrical communication between one or more components of the display assembly 1010. In some examples a flexible electrical connector 1070 can include a ferrite material and can include an integrated NFC coil therein. Both the ferrite material and the coil can be coated or covered with an insulating polymer material, such as a polyimide or pressure sensitive adhesive material. In some examples, the flexible electrical connector 1070 including a ferrite material and NFC coil can have a thickness of less than about 300 microns, less than about 250 microns, less than about 225 microns, or even thinner.

Thus, a separate NFC coil or component is not necessary and the amount of space taken up by the display assembly 1010 can be reduced. In some examples, the NFC coil in the flexible electrical connector 1070 is driven as a radiating element by one or more components in communication therewith.

Additional conductive components can also be provided to assist with grounding the components of the display assembly 1010 and other system components of a device including the display assembly 1010. For example, a conductive material, such as a conductive tape 1072, can be provided over one or more components (not shown) and can be electrically connected to the grounding plane. Additional tapes or conductive components can be provided to cover most or substantially all of the surface of the display assembly shown in FIG. 8A. In some examples, the use of one or more conductive tapes 1072 to electrically connect components to the grounding plane 1060 can improve antenna performance by at least about 0.2 dB, at least about 0.3 dB, at least about 0.4 dB, at least about 0.5 dB, or at least about 1 dB or more across all radiating frequencies, as compared to a display assembly 1010 that does not include tape 1072.

Figure 8B:
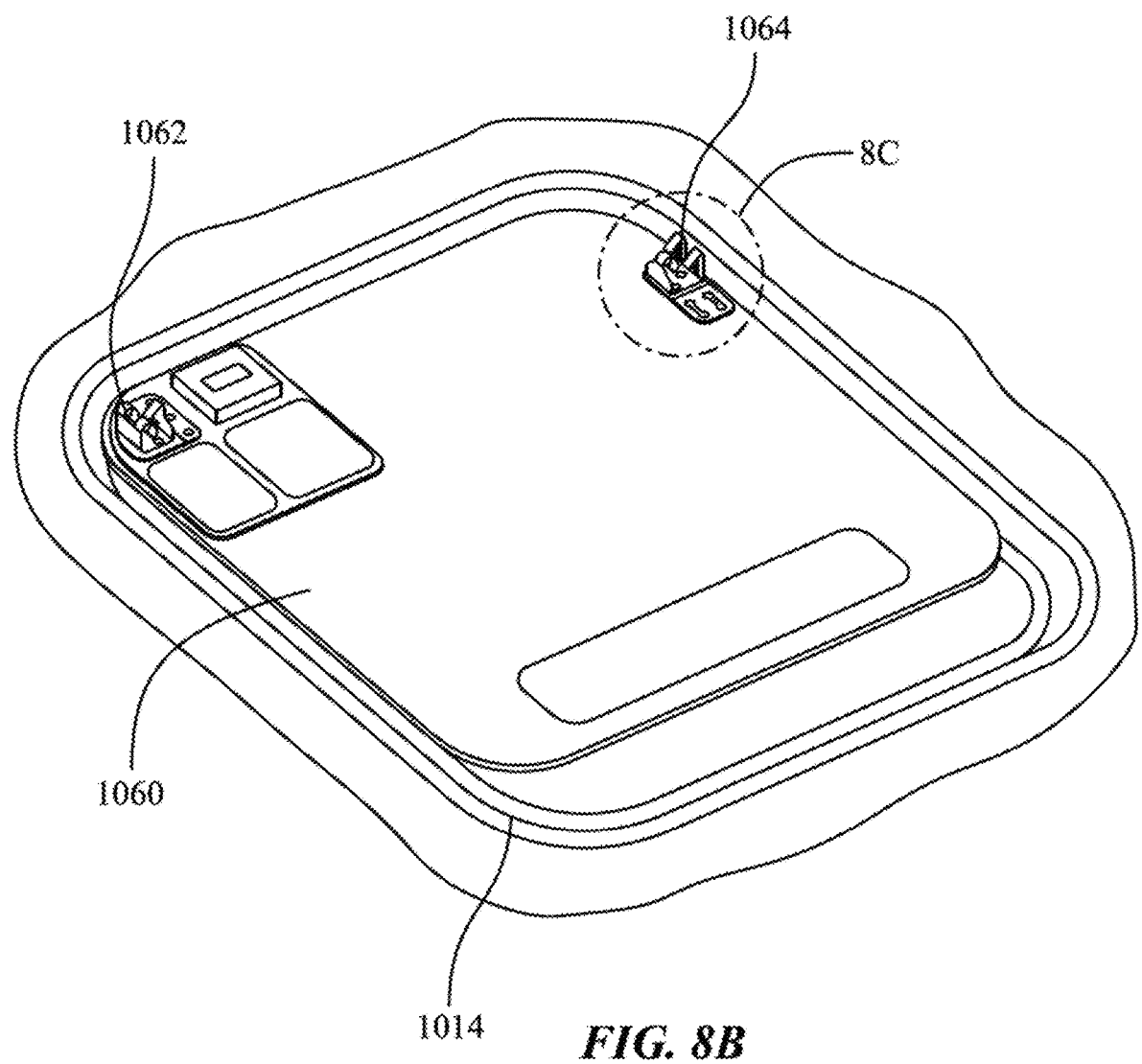
FIG. 8B shows a bottom perspective view of a portion of the electronic device of FIG. 8A.

FIG. 8B shows a bottom perspective view the display assembly 1010 as shown in FIG. 8A, with several components omitted for simplicity. As can be seen, spring fingers 1062, 1064 can be located on the grounding plane 1060 and can be in electrical communication therewith. Further, because the grounding plane 1060 is a substantially continuous sheet or plane that extends across a large portion of the area of the display assembly, the spring fingers 1062, 1064 can be disposed at substantially any desired location on the grounding plane 1060. Accordingly, the arrangement of other components of the display assembly 1010 can be designed according to other goals, such as desired levels of antenna performance and/or space reduction, and the spring fingers 1062, 1064 can be positioned to accommodate the positions of those components. That is, the spring fingers 1062, 1064 can be positioned independent of the other components of the display assembly 1010.

Figure 8C:
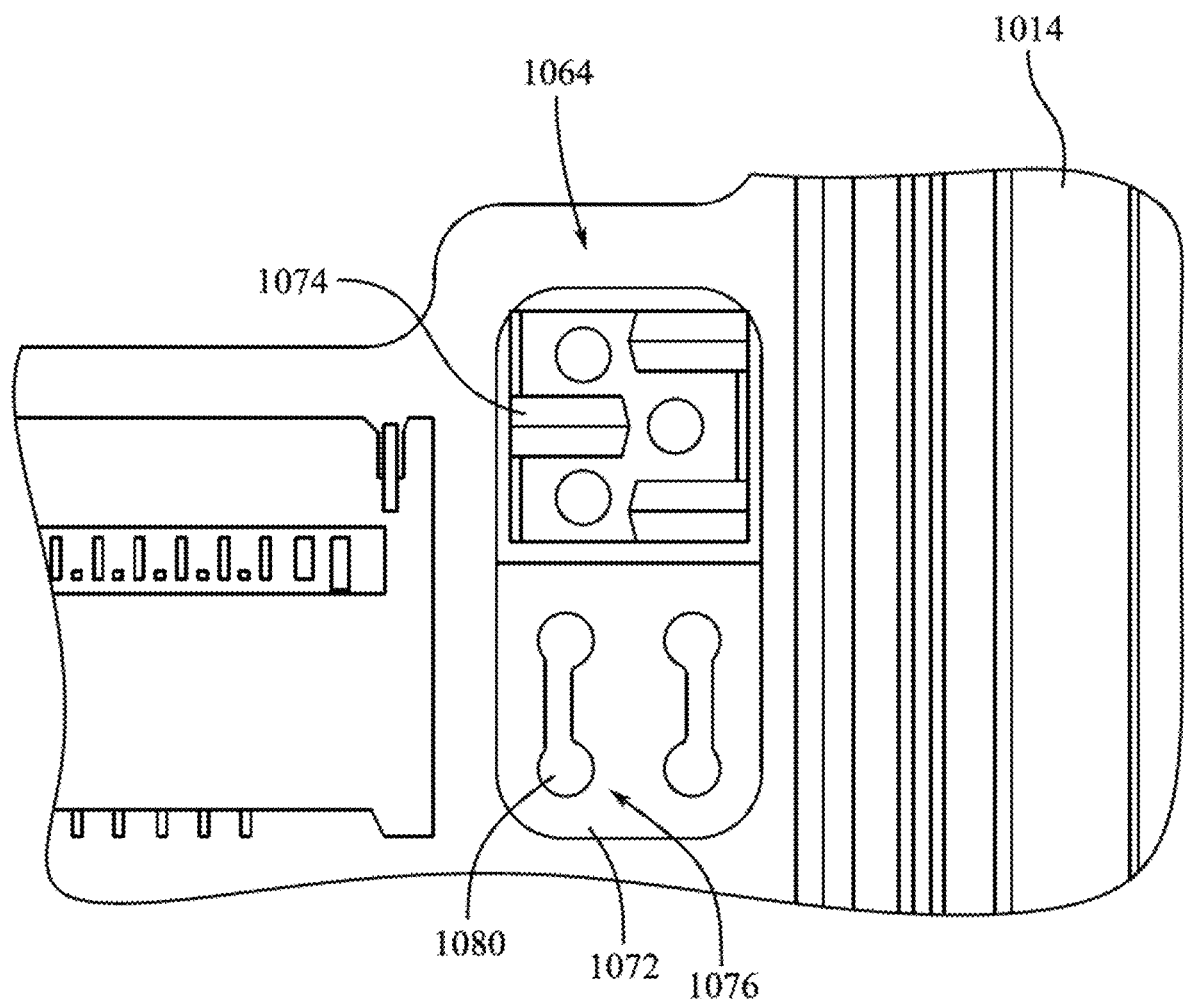
FIG. 8C shows a top view of a portion of the electronic device of FIG. 8A.

FIG. 8C shows a close up view of the spring finger 1064 disposed near a contact portion 1080 of the grounding plane 1060. In some examples, the spring finger 1064 can include any form of conductive material, such as one or more metals. As shown, the spring finger 1064 can include a receiving portion 1074 that can receive a connector or a portion of another electrical component to provide an electrical connection therewith. The spring finger 1064 can also include a connection portion 1072 that can be disposed in contact with the contact portion 1080. The connection portion 1072 can define one or more apertures 1076. During assembly, solder or another conductive material can be placed or otherwise located over or in the apertures 1076 to electrically connect the spring finger 1064 to the grounding plane 1060 and to mechanically secure it thereto.

Figure 8D:
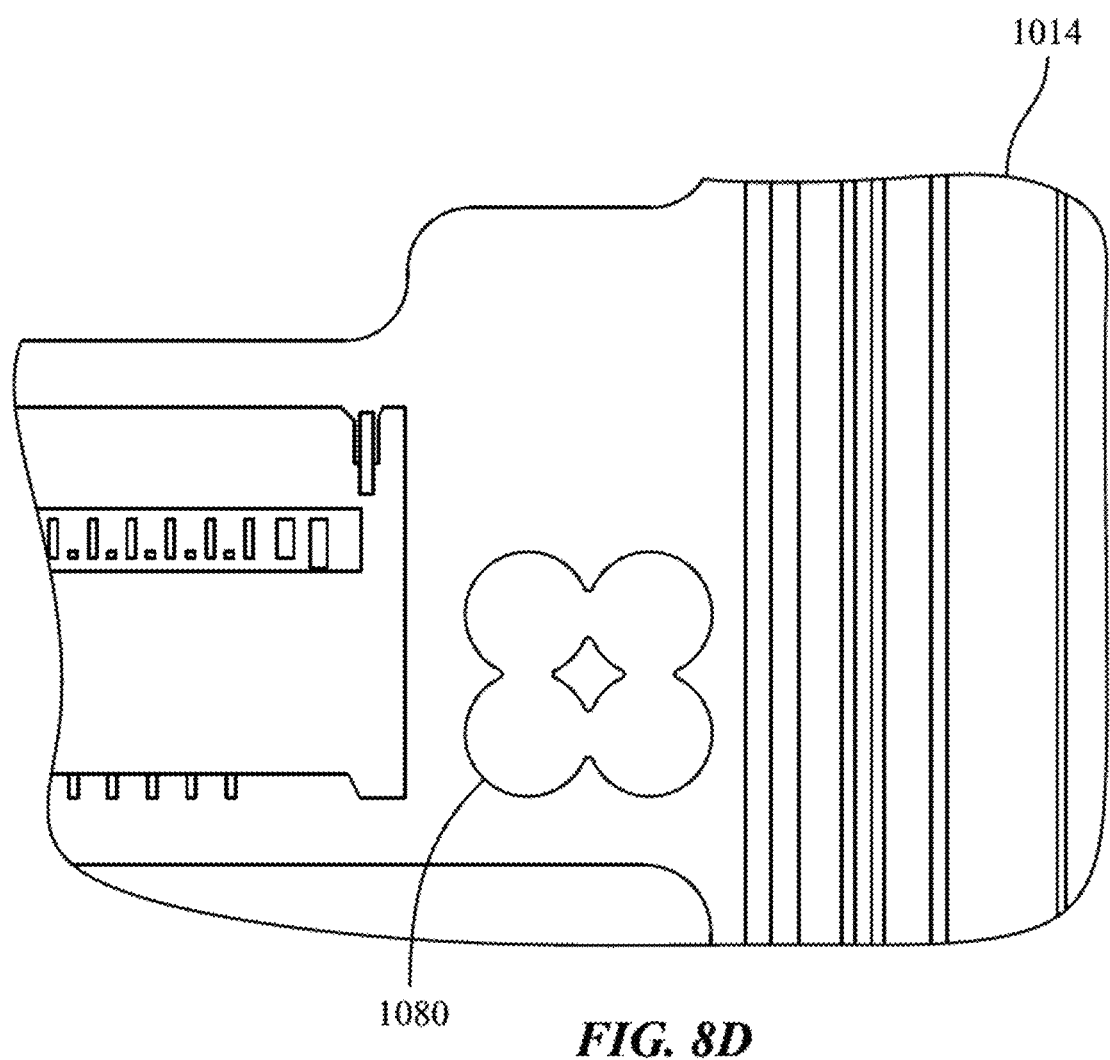
FIG. 8D shows a top view of a portion of the electronic device of FIG. 8A.

In some examples, the spring finger 1064 can be soldered to the grounding plane 1060 by a jet or nozzle based soldering process, whereby balls or portions of solder material can be shot or dropped towards the aperture 1076 from a nozzle. The solder can be melted by a laser after it is emitted from the nozzle, whereupon it can achieve a molten or semi-molten state and can impact the aperture 1076. The solder can then cool to provide a strong and reliable electrical connection without subjecting other components of the display assembly 1010 to excess levels of heat. FIG. 8D shows a top view of the same portion of the display assembly 1010 shown in FIG. 8C with the spring finger 1064 omitted. As can be seen, the contact portion or pad 1080 of the grounding plane 1060 can be sized and shaped to correspond to the apertures 1076 of the spring finger 1064. Further details regarding the grounding of components in electronic devices are described with respect to FIG. 9.

Figure 9:
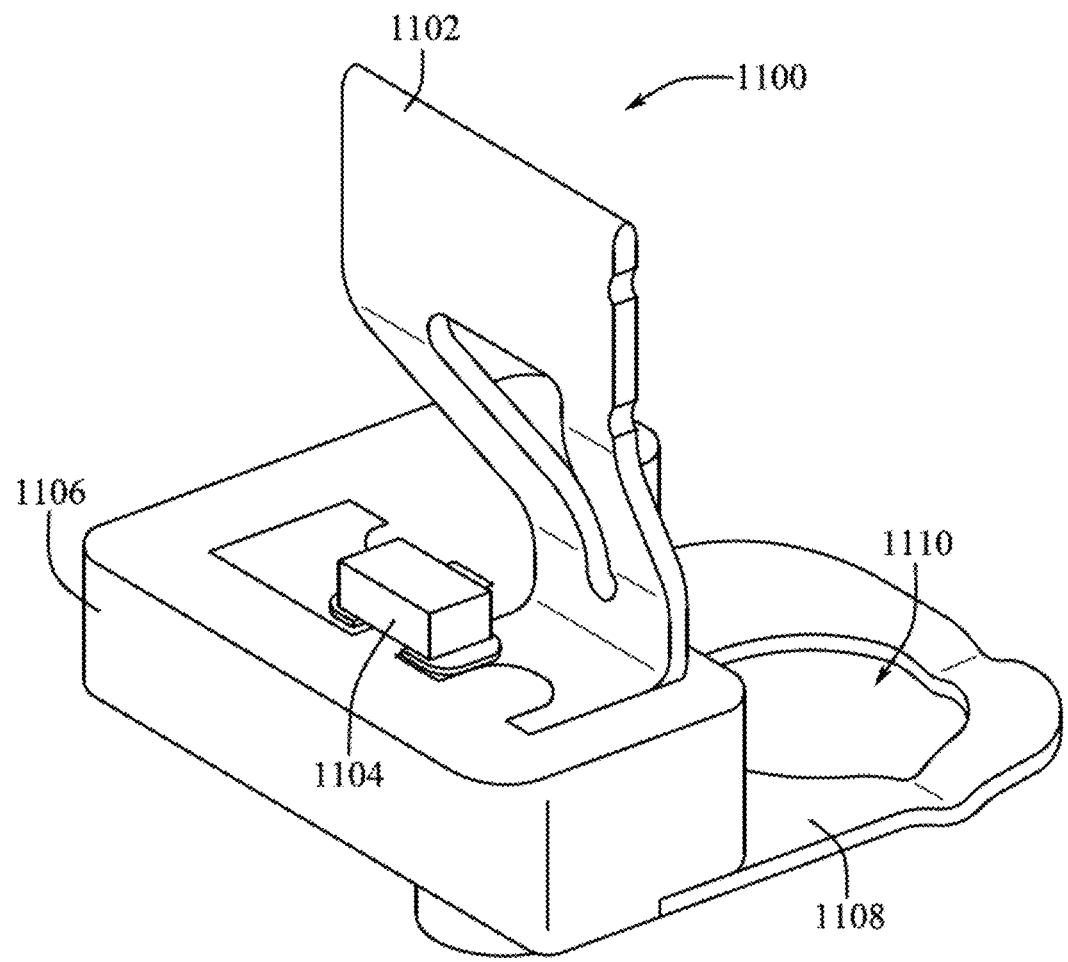
FIG. 9 shows a perspective view of a component of an electronic device.

FIG. 9 shows a perspective view of a grounding component 1100 of an electronic device, such as any of the electronic devices described herein. The grounding component 1100 can be used to connect any number of components of an electronic device to one another and/or to a ground, such as the grounding plane 1060 described with respect to FIGS. 8A-8D. In some examples, the grounding component 1100 can be used instead of, or in addition to, the spring fingers 1062, 1064 described with respect to FIGS. 8A-8D.

In some examples, the grounding component 1100 can include a first contact portion 1108 that can define an aperture 1110. As with the apertures 1076 defined by the spring finger 1064, solder can be placed or deposited on or in the aperture 1110 to electrically and mechanically connect the grounding component 1100 to another component, such as the grounding plane 1060. The grounding component 1100 can further include a body 1106 connected to the first contact portion 1108, and a second contact portion 1102 that can extend from the body 1106 to electrically and/or physically connect with one or more components of a device including the grounding component 1100. Although the second grounding portion 1102 is shown having a particular geometry, it can have substantially any desired shape and the shape and size of the second contact portion 1102 can be selected based on the location of the grounding component 1100 and any components with which a connection to the second contact portion 1102 is desired.

The body 1106 can be a polymeric material and can be insert molded around the contact portion 1102, 1108. The body can also carry a tuning component 1104 that can be electrically connected to the contact portions 1102, 1108. In some examples, the contact portions 1102, 1108 can be electrically isolated from one another except for their connection to the tuning component 1104. In some examples, the tuning component 1104 can include an electrical component having a desired resistance, inductance, and/or capacitance. Thus, in some examples, the tuning component 1104 can include an inductor and/or capacitor. In some examples, the tuning component 1104 can be an inductor having an inductance of between about 1 and about 10 nanohenries (nH), although the tuning component 1104 can have substantially any inductance as desired. Further, in some examples, one or more of the resistance, inductance, or capacitance of the tuning component 1104 can be selectively tuned or adjusted, as desired, after assembly or partial assembly of a device including the grounding component 1100.

In some examples where the grounding component 1100 is electrically connected to an antenna, the electrical properties of the tuning component 1104, such as the resistance, inductance, and/or capacitance, can be selected to tune or shift the resonant frequency of the antenna or an electrical circuit including the antenna, as desired. This tuning or shifting can have the effect of making the antenna appear "shorter" or "longer," thus effectively making it appear as though the antenna is grounded at different locations from the point of view of the antenna. In this way, the grounding location of an antenna can be chosen based on design considerations other than the path length to ground, such as the position of other components, and the grounding component 1100 can then be tuned to provide an effective grounding "location" that achieves optical antenna performance, as desired.

Any number or variety of components in any of the configurations described herein can be included in an electronic device as described herein. The components can include any combination of the features described herein and can be arranged in any of the various configurations described herein. The structure and arrangement of components of a device, as well as the concepts regarding their use and operation can apply not only to the specific examples discussed herein, but to any number of embodiments in any combination. Various examples of electronic devices and electronic device sealing and cover components including those having various features in various arrangements are described below, with reference to FIGS. 10A and 10B.

Figure 10A:
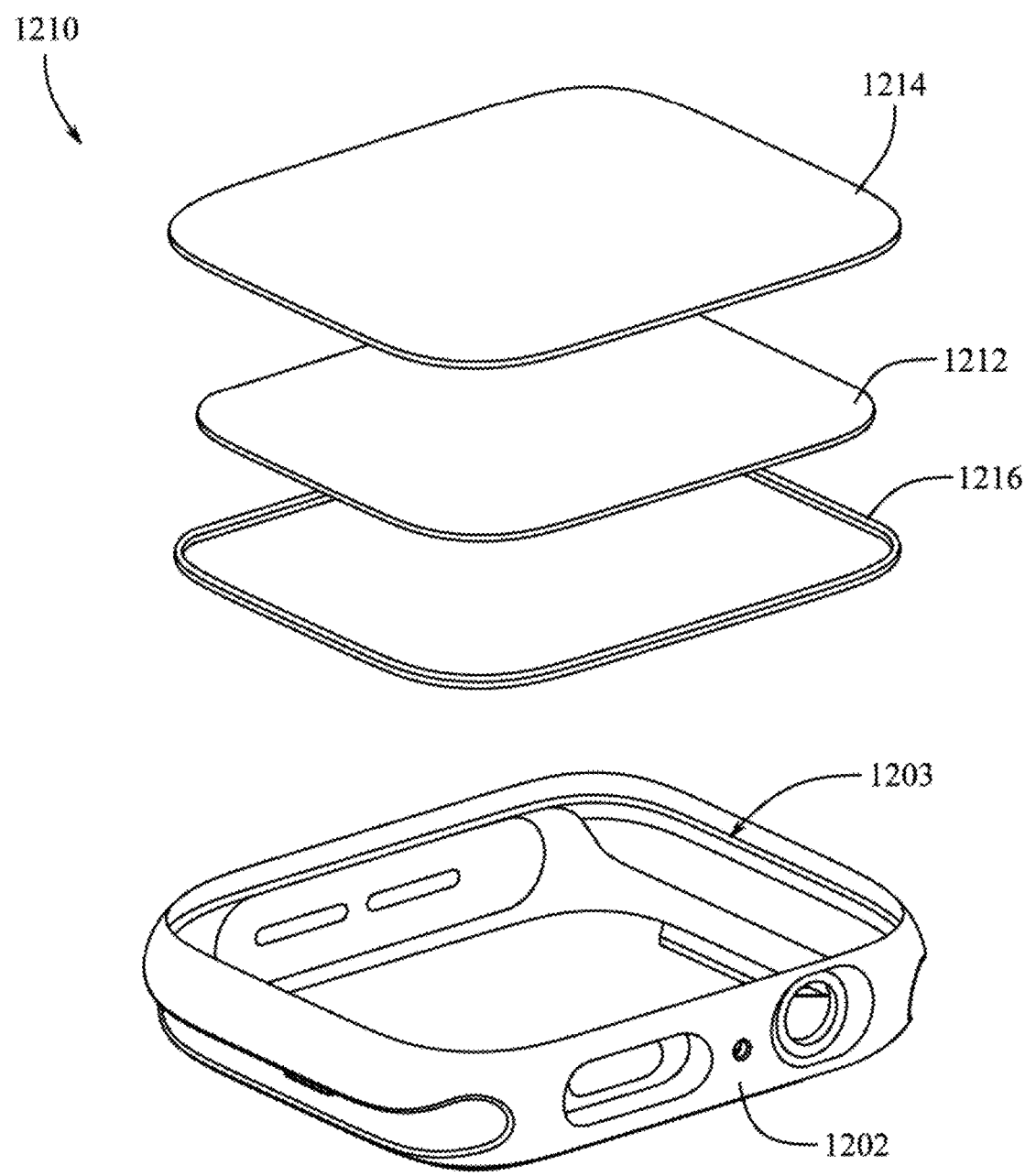
FIG. 10A shows an exploded view of a portion of an electronic device.

FIG. 10A shows an exploded view of several components of an electronic device that can be substantially similar to and can include some or all of the features of the electronic devices described herein. As described with respect to the electronic device 300 of FIG. 2A, an electronic device can include a housing 1202 that can at least partially define an internal volume and a display assembly 1210 that can be retained by the housing. The display assembly 1210 can be received by and can be attached to the housing 202, for example, at a feature defined by the housing 1202, such as a ledge, lip, or flange 1203. The display assembly can include a cover 1214 including a transparent material, such as plastic, glass, and/or ceramic. The display assembly 1210 can include a display stack 1212 that can include multiple layers and components, each of which can perform one or more desired functions. In some examples, a gasket or a seal 1216 can be disposed between the display assembly 1210 and the housing 1202, for example at the ledge 1203, to substantially define a barrier to the ingress of liquids or moisture into the internal volume from the external environment at the location of the seal 1216.

Figure 10B:
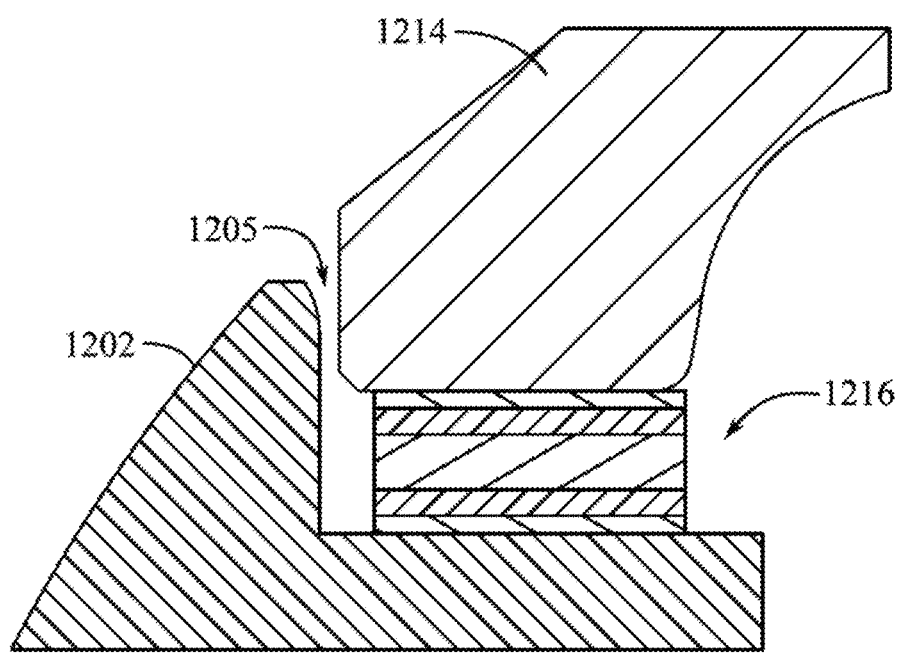
FIG. 10B shows a cross-sectional view of the electronic device of FIG. 10A.

FIG. 10B shows a cross-sectional view of the housing 1202, with the transparent cover 1214 and seal 1216 attached to the housing in an assembled configuration. As can be seen, the seal 1216 can be in contact with the transparent cover 1214 and the housing 1202, and can fix or secure these two components together. In some examples, the seal 1216 can include multiple layers of material. As described herein, the seal 1216 can include polymer, metal, and/or ceramic materials. In some examples, the seal 1216 can substantially surround a periphery of an aperture defined by the housing 1202, and can have a shape corresponding to a peripheral shape of one or more portions of the display assembly 1210.

In some examples, the width of the seal 1216 and/or the width of the adhesive bond of between the seal 1216 and the housing 1202 and/or cover 1214 can be important for increasing the chemical resistance of the seal 1216 and preventing corrosion of the seal 1216 and/or ingress of liquid or contaminants into the internal volume therethrough. As shown, the housing 1202 and the cover 1214 can define a gap 1205 therebetween. In some examples, this gap can provide for a certain amount of sway or movement of the cover 1214 relative to the housing 1202, such as during high force events or drop events. This sway and/or compression of the seal 1216 can reduce the risk forces being transmitted directly through the housing 1202 to the cover 1214, thereby reducing the risk of damage to the cover 1214. In some examples, the seal 1216 can include a relatively low modulus, such as less than about 20 MPa, less than about 15 MPa, less than about 10 MPa, less than about 5 MPa, or even less than about 1 MPa, so as to not transmit load to the cover 1214. In this manner, the seal 1216 can act as a shock absorber for the cover 1214 relative to the housing 1202. In some examples, the seal 1216 can be compliant enough that the cover 1214 can move laterally and/or vertically with respect to the housing 1202. In some examples, this amount of movement can be desirable even though the device may not contain a force sensor or other component that may need to rely on movement of the cover 1214 relative to the housing 1202 to function.

In some examples, liquids, particles, contaminants, and/or corrosive materials can inadvertently enter the gap 1205, however, and come in contact with the seal 1216. Thus, it can be desirable for the seal 1216 to be corrosion resistant and for the bond length between the seal 1216 and the housing 1202 and cover 1214 to be relatively large.

Any number or variety of components in any of the configurations described herein can be included in an electronic device, as described herein. The components can include any combination of the features described herein and can be arranged in any of the various configurations described herein. The structure and arrangement of components of a device, as well as the concepts regarding its function and operation can apply not only to the specific examples discussed herein, but to any number of embodiments in any combination. Various examples of electronic devices and electronic device input components including those having various features in various arrangements are described below, with reference to FIGS. 11A-11C.

Figure 11A:
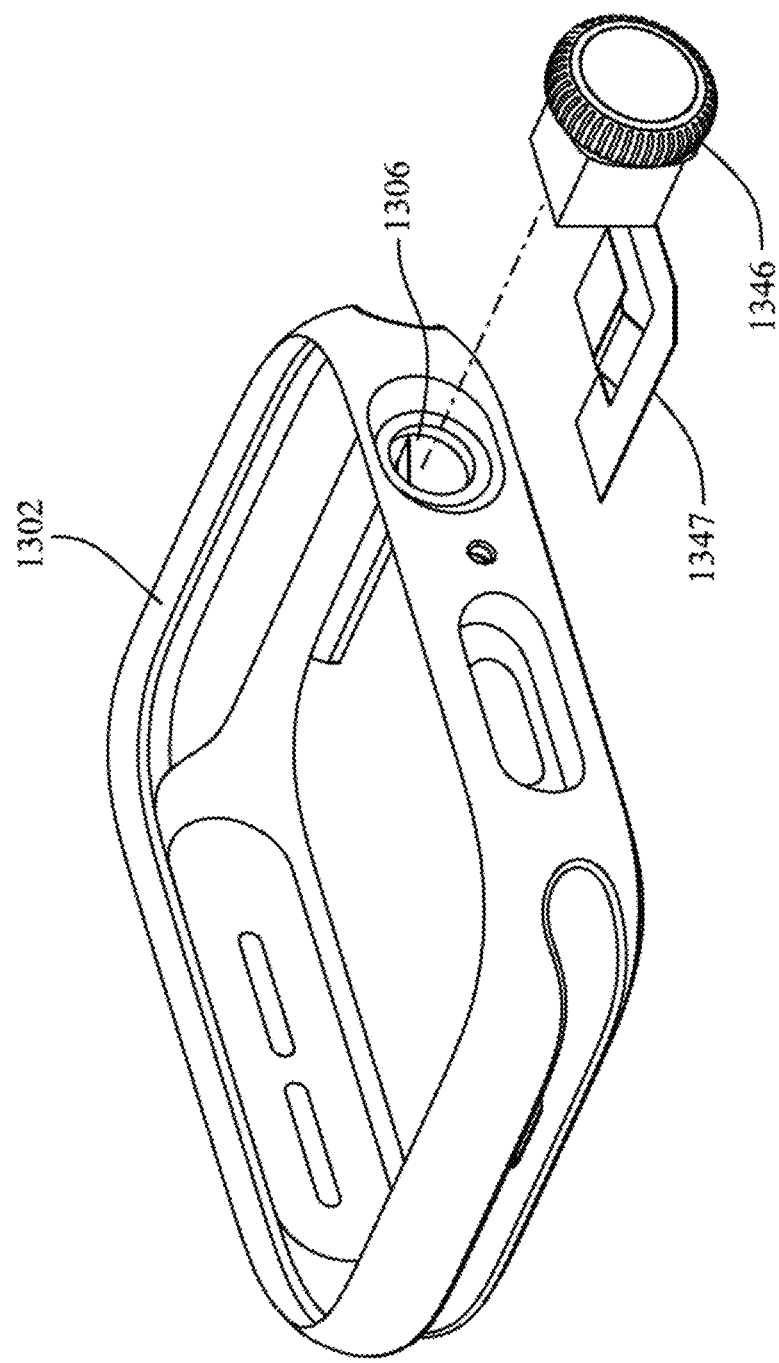
FIG. 11A shows an exploded view of a portion of an electronic device.

FIG. 11A shows an exploded view of several components of an electronic device that can be substantially similar to, and can include, some or all of the features of the electronic devices described herein. As described with respect to the electronic device 300 of FIG. 2A, an electronic device can include a housing 1302 that can at least partially define an internal volume and a crown or dial 1346 that can be positioned at and at, least partially extend through, an aperture 1306 defined by the housing 1302. The crown module 1346 can be connected to a flexible electrical connector 1347 that can be in communication with one or more other components of the device (not shown).

Figure 11B:
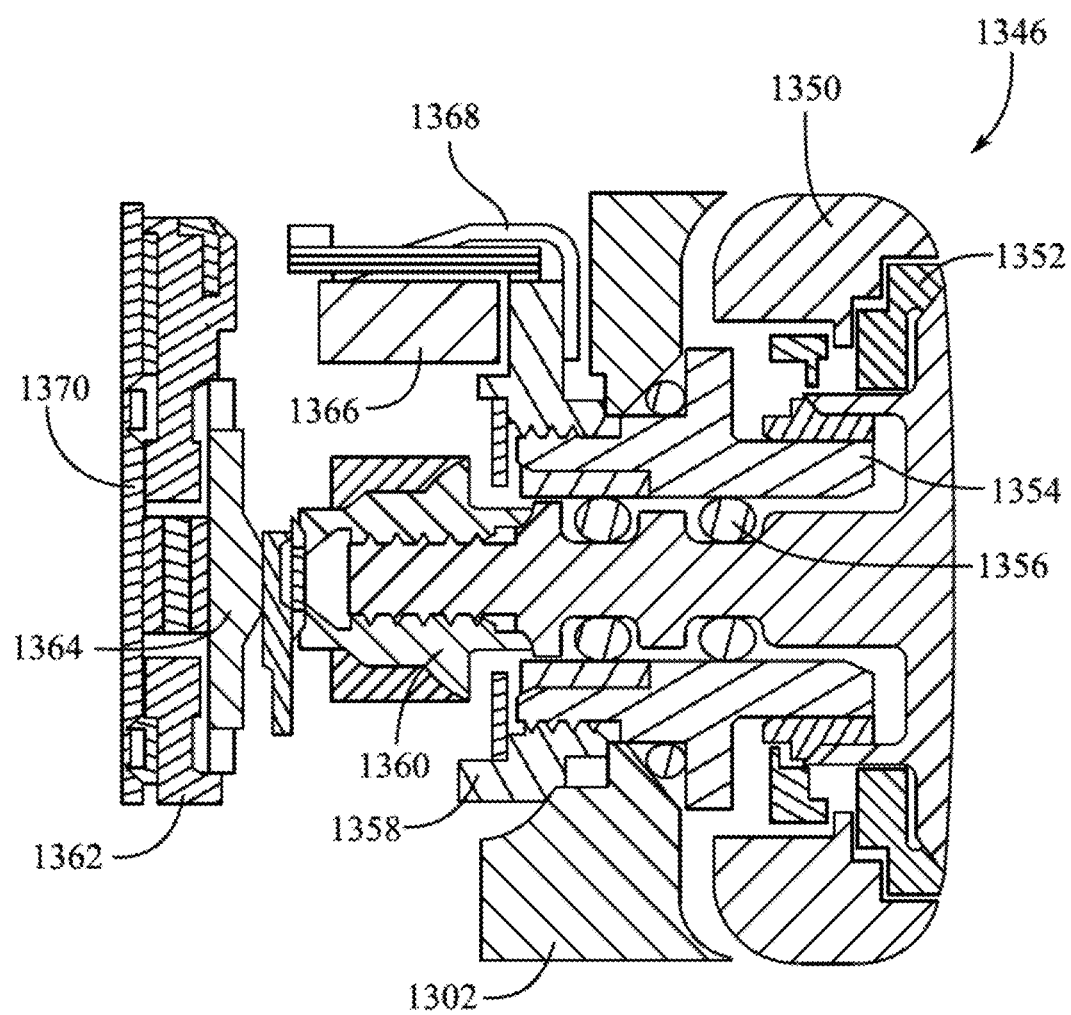
FIG. 11B shows a cross-sectional view of a component of the electronic device of FIG. 11A.

FIG. 11B shows a partial cross-section view of the crown module 1346 affixed to the housing 1302 in an assembled configuration. In some examples, a sleeve or a liner 1354 can be disposed adjacent to the housing 1302 and can be secured and/or sealed thereto. The sleeve 1354 can act to help seal the internal volume of the housing 1302. In some examples, the sleeve 1354 can be an insulating material and can insulate some or all of the crown module 1346 from the housing 1302.

The crown module 1346 can include a dial or a button 1350 that can generally be a flange shaped member that can have a cylindrical body and a rounded or flat top. The button 1350 includes an outer surface that is configured to receive a user input and a stem that extends from an interior surface of the button 1350. The button 1350 can also include a ring component 1352 that can at least partially define an exterior surface of the button 1350 and that can include an electrically insulating material, for example, to electrically insulate two or more portions of the button 1350. In some examples, one or more sealing members 1356, such as an O-ring, a cup seal, or a membrane, can be received around the shaft of the button 1350 to seal against the sleeve 1354.

The crown module 1346 can also include an electrically conductive grounding component 1358 that can be in electrical communication with one or more portions of the crown module and that can provide electrical grounding thereto. In some examples, the grounding component 1358 can include a metal or metals and can be formed by a metal injection molding (MIM) process in a desired shape. The grounding component 1358 can further be in electrical communication with a conductive component 1368 that can be electrically connected to other components of an electronic device containing the crown module 1346. By using a metallic part to provide grounding, rather than a separate electrical connector, the overall size of the crown module 1346 can be reduced by eliminating the need for a connection point and/or solder for the electrical connector. The crown module 1346 can include one or more bushings, such as an insert molded bushing 1360. This bushing 1360 can include any material as desired. Further, because it is insert molded, it can be shaped and size as desired, for example, to reduce the overall size of the crown module 1346.

A tactile switch mechanism 1364 can be disposed in contact with the stem of the button 1350 and can be secured to a support structure or bracket 1370. The tactile switch mechanism 1364 can be depressed when a user presses on the button 1350 and can transmit one or more signals upon the occurrence of such an event. The bracket 1370 can further support one or more operational components of the crown module 1346, such as one or more electrical and/or electronic components. In some examples, an overmold material 1362 can be provided around these components in a SiP configuration in order to reduce the overall size of the crown module, as described herein. A shear plate can also be attached to the bracket to prevent shearing forces from being transmitted to the tactile switch mechanism 1364 or other components. In some examples, the shear plate can be laser welded to the bracket 1370 or to one or more other components of the crown module 1346. The crown module 1346 can also include one or more sensors 1366, such as one or more rotation sensors, to detect a rotational input on the button 1350.

Figure 11C:
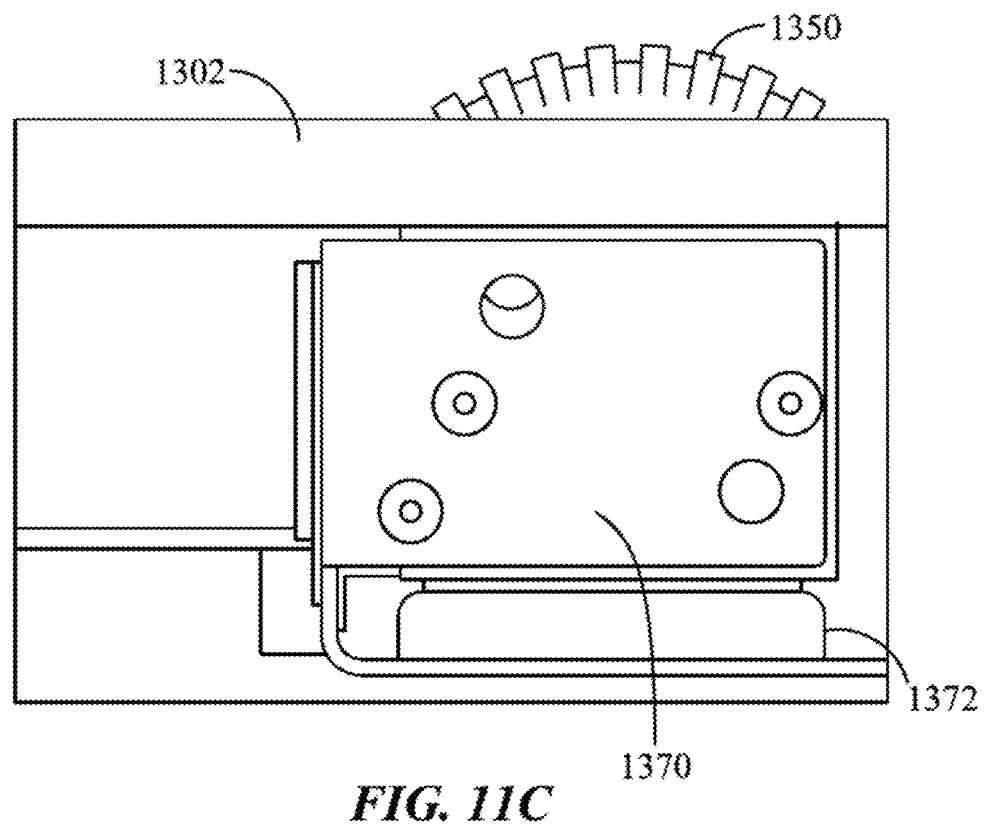
FIG. 11C shows a rear view of a component of the electronic device of FIG. 11A.

FIG. 11C shows a rear view of the crown module 1346 disposed in an assembled configuration in the housing 1302. As can be seen, substantially all of the components of the crown module 1346 can be disposed within a volume at least partially defined by the bracket 1370. This configuration can allow for the positioning of other components of a device including the crown module 1346 substantially near or adjacent to the crown module 1346, thereby further increasing available space within the internal volume defined by the housing 1302. In some examples, one or more operational components that are overmolded with a polymer material to form a SiP 1372 as described herein can be disposed on, carried by, and/or positioned within a volume at least partially defined by the bracket 1370. Overmolding the one or more components to form the SiP 1372 can reduce potential interference with other systems of the device by the operational components of the SiP 1372, further enabling other components to be positioned adjacent to, or substantially near to crown module 1346.

Any number or variety of components in any of the configurations described herein can be included in an electronic device, as described herein. The components can include any combination of the features described herein and can be arranged in any of the various configurations described herein. The structure and arrangement of components of a device, as well as the concepts regarding the function and operation thereof can apply not only to the specific examples discussed herein, but to any number of embodiments in any combination. Various examples of electronic devices and electronic device components including having various features in various arrangements are described below, with reference to FIGS. 12A-13D.

Figure 12A:
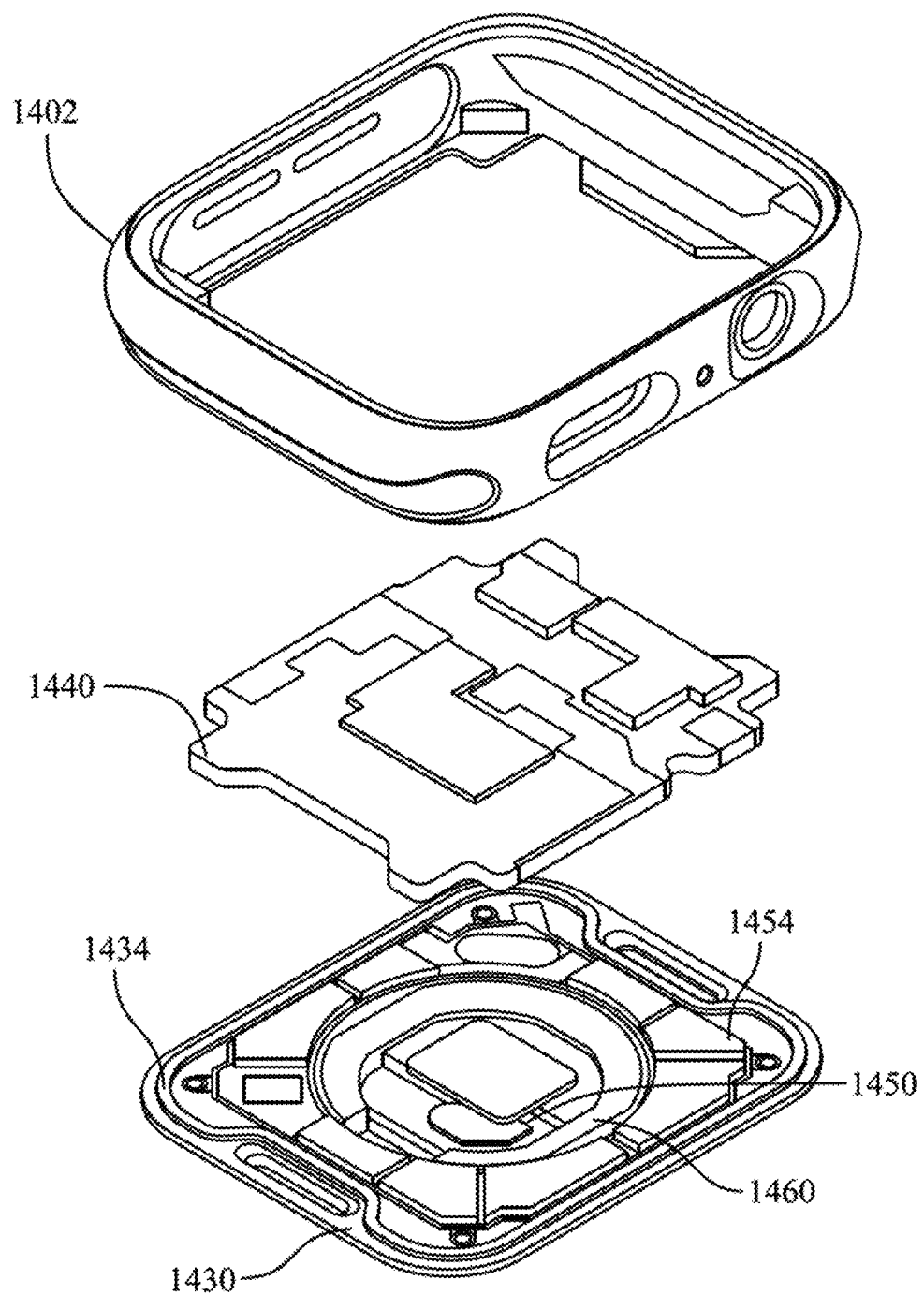
FIG. 12A shows an exploded view of a portion of an electronic device.

FIG. 12A shows an exploded view of several components of an electronic device that can be substantially similar to and can include some or all of the features of the electronic devices described herein. As described with respect to the electronic device 300 of FIG. 2A, an electronic device can include a housing 1402 that can at least partially define an internal volume, a main logic board 1440 disposed in the internal volume, and a back cover 1430 that can be affixed to the housing 1402.

In some examples, the back cover 1430 can carry a number of components thereon, such as a second logic board 1450, an e-shield 1460, and an antenna element 1454. In some examples, a seal 1434 can be disposed between the back cover 1430 and the housing 1402 to provide or define a barrier between the internal volume and the ambient environment, as described herein. In some examples, as shown, a shape of the seal 1434 can correspond to a shape of the logic board 1440 and/or antenna element 1454. This design can allow for an increased area of the logic board 1440 to provide room for additional components, as well as for an increased area or size of the antenna element 1454.

Figure 12B:
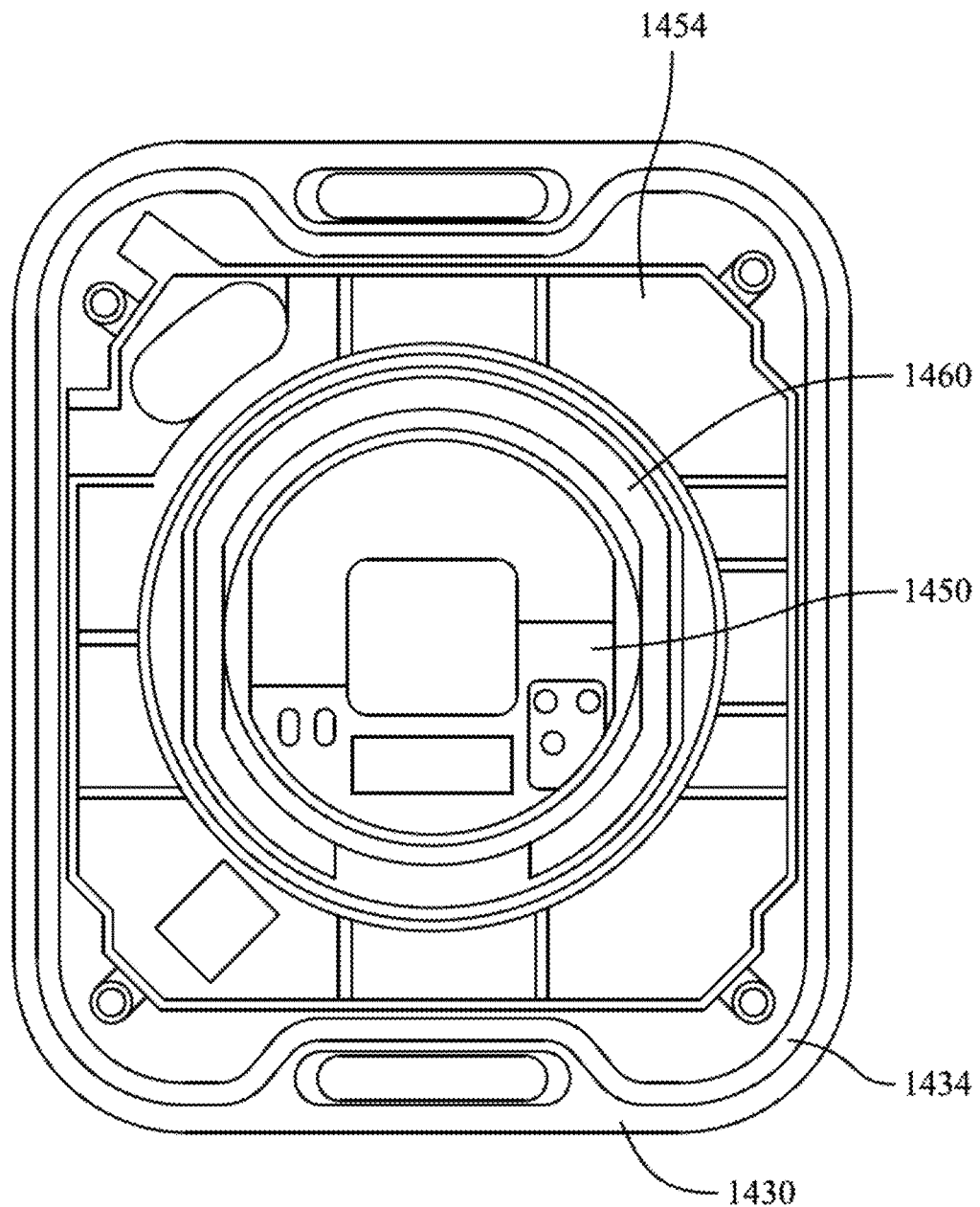
FIG. 12B shows a top view of a portion of the electronic device of FIG. 12A.

FIG. 12B shows a top view of the back cover 1430 carrying the components described with respect to FIG. 12A. The back cover 1430 can carry additional components that have been omitted for simplicity. In some examples, the antenna element 1454 can be a radiating element of one or more antennas of an electronic device, such as any of the antennas described herein. In some examples, the antenna element 1454 can be sized and shaped to correspond to any available volume in the device that is not occupied by other components. In some examples, the antenna element 1454 can include a conductive material, such as one or more metals, as well as non-conductive materials, such as one or more polymers. The antenna element 1454 can be electrically connected to other components of the device, such as the logic board 1440, to provide a signal and/or power to drive the antenna. In some examples, the antenna element 1454 can be formed by a laser direct structure (LDS) process and can thus include a polymer, such as a thermoplastic material, having a metallic or metal-containing design or track formed therein.

In some examples, the e-shield component 1460 can be sized and shaped to correspond to a size and shape of one or more components of the device or back cover 1430, such as the logic board 1450. In some examples, the e-shield can include one or more metals and can provide shielding from electromagnetic radiation to one or more components of the device. In some examples, however, the e-shield 1460 can be electrically connected to an antenna to additionally act as a radiating element for the antenna. In some examples, the e-shield 1460 can provide an auxiliary short point for the antenna and/or can be used to increase the length of the radiating element of the antenna. Further, in some examples, some or all of the e-shield 1460 can be disposed below the radiating element 1454 and can be capacitively coupled therewith to enhance antenna performance.

Figure 12C:
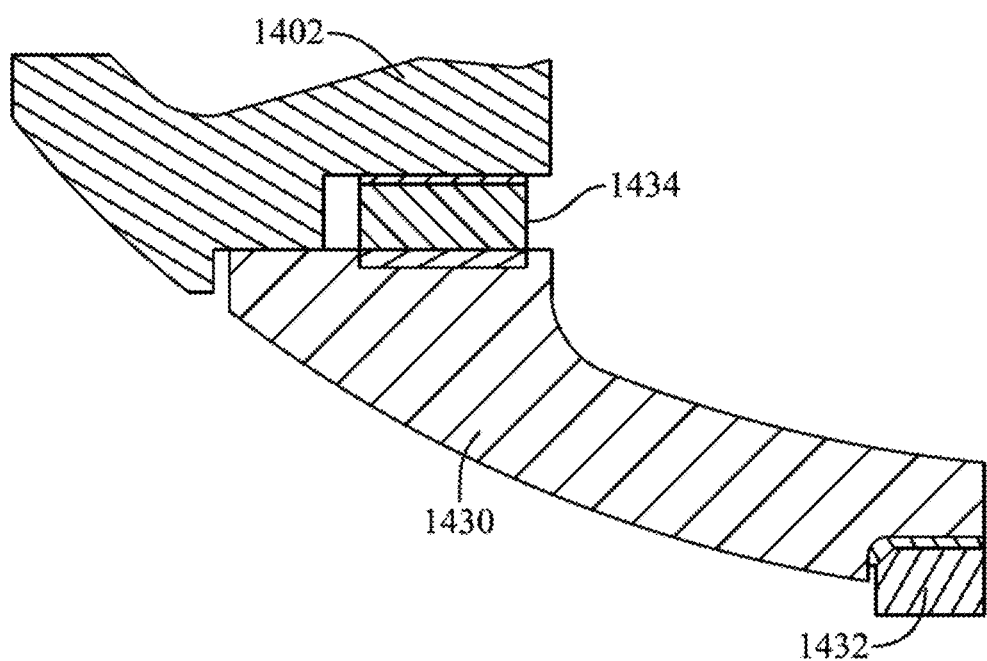
FIG. 12C shows a cross-sectional view of the portion of the electronic device of FIG. 12A.

FIG. 12C shows a cross-sectional view of a portion of the back cover 1430 joined to the housing 1402 in an assembled configuration, with a seal 1434 disposed therebetween. As described herein, the back cover 1430 can also include an electromagnetically transparent component 1432. The seal 1434 can include multiple layers of material, such as silicone, polyimide, and/or pressure sensitive adhesive. In some examples, the seal 1434 can have a substantially rectangular cross-sectional area, and can be substantially similar to, and can include some or all of the features of the seals described herein. In some examples, the seal 1434 may not extend past an edge of the housing 1402 and/or back cover 1430. Further, the mating surfaces of the housing 1402 and/or the back cover 1430 can be substantially flat to provide a large adherence area with the seal 1434. In some examples, the back cover 1430 can directly abut the housing 1402, for example, to act as a datum.

Figure 12D:
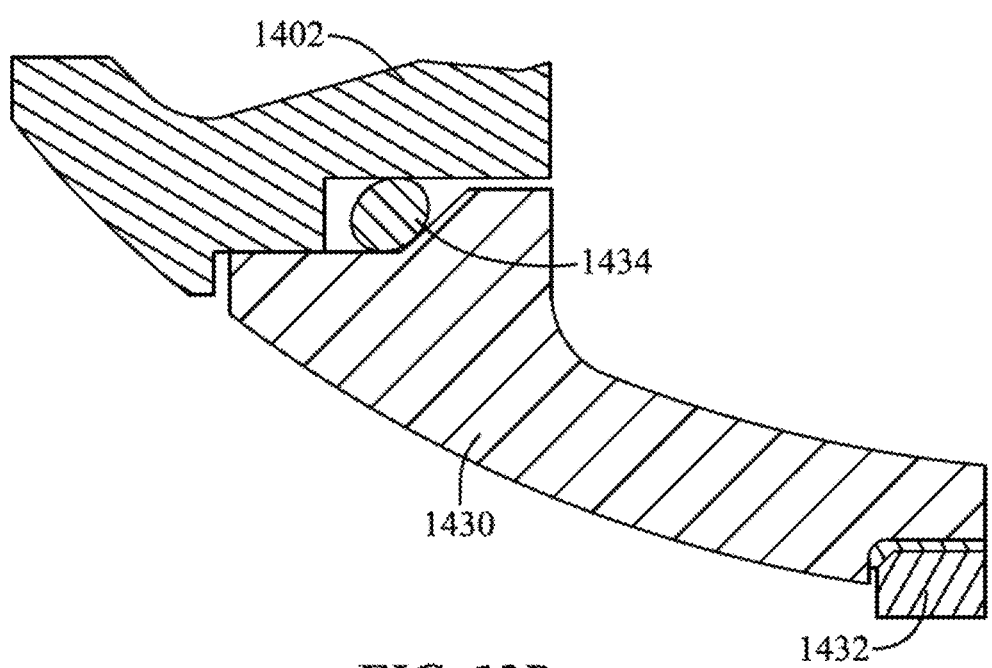
FIG. 12D shows a cross-sectional view of the portion of the electronic device of FIG. 12A.

FIG. 12D shows the same cross-sectional view as in FIG. 12C, including an alternative configuration of the surface of the back cover 1430 that mates with the housing 1402 and seal 1434. In this example, the seal 1434 can have a substantially rounded or circular cross-sectional area. The mating surface of the back cover 1430 can be sloped or have a slanted region that can exert a pressure on the seal 1434 in a direction against the housing 1402.

Figure 12G:
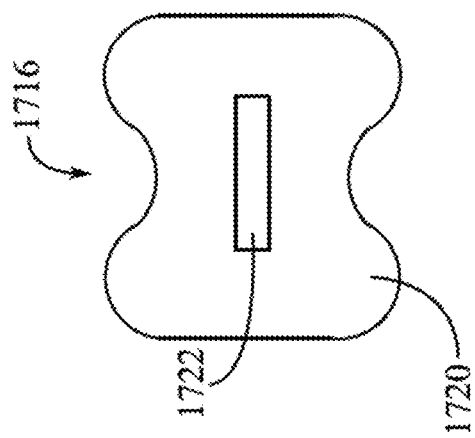
FIG. 12G shows a cross-sectional view of a component of an electronic device.
Figure 12F:
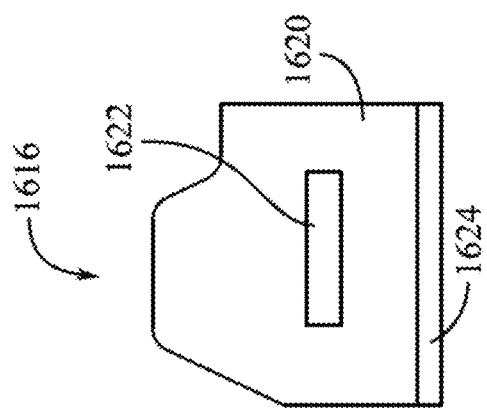
FIG. 12F shows a cross-sectional view of a component of an electronic device.
Figure 12E:
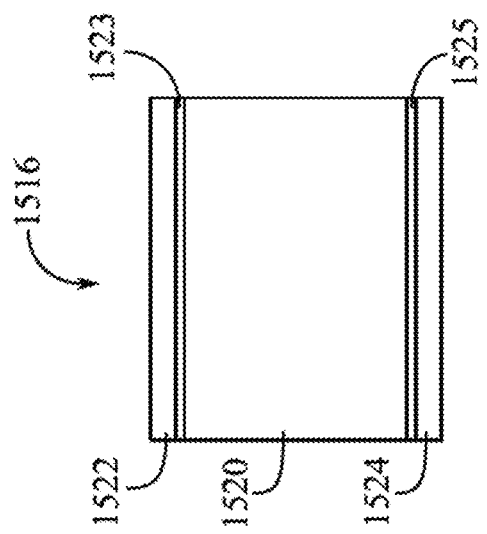
FIG. 12E shows a cross-sectional view of a component of an electronic device.

FIG. 12E shows a cross-sectional view of a seal 1516, that can be substantially similar to, include some or all of the features of, and be used in place of other seals described herein, such as seal 1216 and/or seal 1434 shown in FIG. 12C. In some examples, the seal 1516 can include multiple layers of material bonded or joined together in a stacked configuration. In some examples, the seal 1516 can include a silicone layer 1520, such as a silicone rubber layer. The silicone layer 1520 can be the middle layer or core of the seal 1516 and can have a thickness of between about 50 microns and about 300 microns, or between about 100 microns and about 200 microns, for example about 150 microns. In some examples, the silicone layer 1520 can be substantially transparent. The silicone layer 1520 can have a hardness of greater than about 5, greater than about 10, or greater than about 15 or more on the Shore A hardness scale.

In some examples, polymer layers 1523 and 1525 can be disposed on the top and bottom surfaces of the silicone layer 1520. These polymer layers 1523, 1525 can be the same or different materials, and in some examples, can include polyimide. In some examples, the polymer layers 1523, 1525 can be transparent or translucent. In some examples, the polymer layers 1523, 1525 can be a colored translucent material, such as a translucent amber colored material. In some examples, the polymer layers 1523, 1525 can be the same or different thicknesses. The polymer layers 1523, 1525 can have thicknesses between about 25 microns and about 150 microns, or between about 50 microns and about 100 microns, for example about 75 microns.

In order to secure the back cover 1430 to the housing 1402, as shown in FIG. 12C, in some examples, the top and bottom exterior surfaces of the seal can be defined by adhesive layers 1522, 1524. These adhesive layers can be the same or different material and can have the same or different thicknesses. In some examples, the adhesive layers 1522, 1524 can include a pressure sensitive adhesive material. The adhesive layers 1522, 1524 can have thicknesses between about 10 microns and about 100 microns, or between about 25 microns and about 75 microns, for example about 50 microns. The adhesive layers 1522, 1524 can have a hardness of greater than about 5, greater than about 10, greater than about 12, or greater than about 15 or more on the Shore A hardness scale.

Thus, in some examples, the entire seal 1516 can have a thickness of between about 200 microns and about 600 microns, or between about 300 microns and about 600 microns, for example about 400 microns. Further, the seal can have a width of between about 500 microns and about 1500 microns, or between about 750 microns and about 1250 microns, for example about 900 microns.

Referring again to FIG. 12C, the width of the seal 1516 and/or the width of the adhesive bond of the adhesive layers 1522, 1524 can be important for increasing the chemical resistance of the seal 1516 and preventing corrosion of the seal 1516 and/or ingress of liquid or contaminants into the internal volume therethrough.

FIGS. 12F and 12G illustrate cross-sectional views of alternative seal designs 1616 and 1716. In some examples, a seal 1616 can include a relatively stiff core material 1622 surrounded by a relatively soft or compliant material 1620. In some examples, the core 1622 can include one or more metals and/or polymers, such as stainless steel. The core 1622 can then be overmolded with a polymer material 1620, such as a silicone material in any desired shape. In some examples, one or more layers of adhesive 1625 can be disposed on one or more surfaces of the silicone layer 1620 to adhere the seal 1616 to components such as a housing or a cover.

The seal 1716 can also include a core 1722 that can include one or more metals and/or polymers, such as stainless steel and that can be overmolded with a polymer material 1720, such as silicone. As shown, the seal 1716 can have a substantially X-shaped cross-section, for example, defining one or more indentations or divots that can extend partially or entirely along one or more surfaces of the seal 1716. In some examples, the shape of the seal 1716 can allow for desired levels of compression or deformation of the seal 1716 to effectively dissipate energy and to provide a desired level of sealing between components. Further details regarding components carried by the back cover 1430, such as a logic board, are provided below with reference to FIGS. 13A-13D.

Figure 13A:
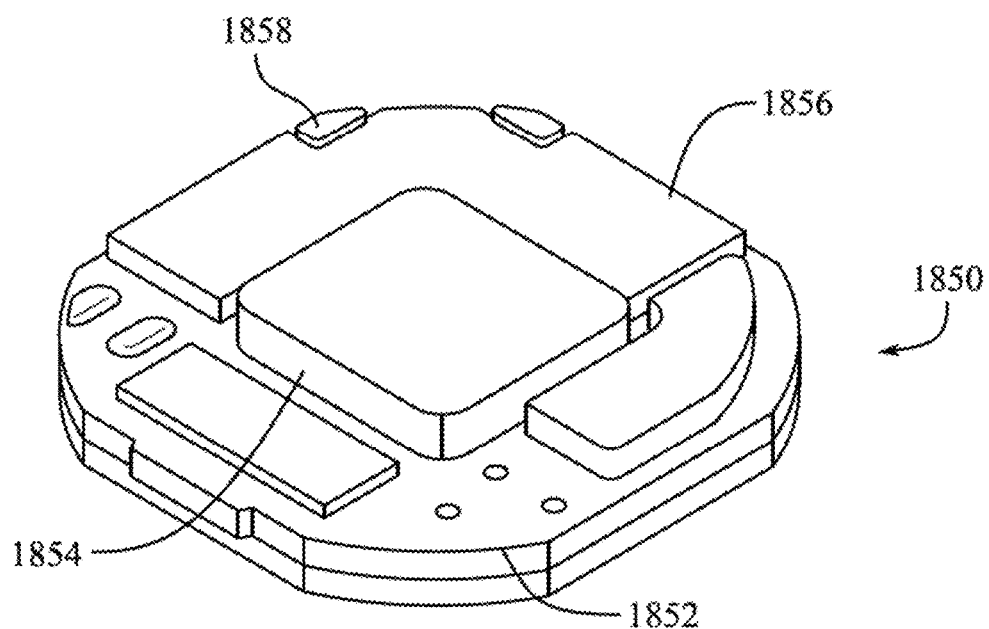
FIG. 13A shows a perspective view of a component of an electronic device.
Figure 13B:
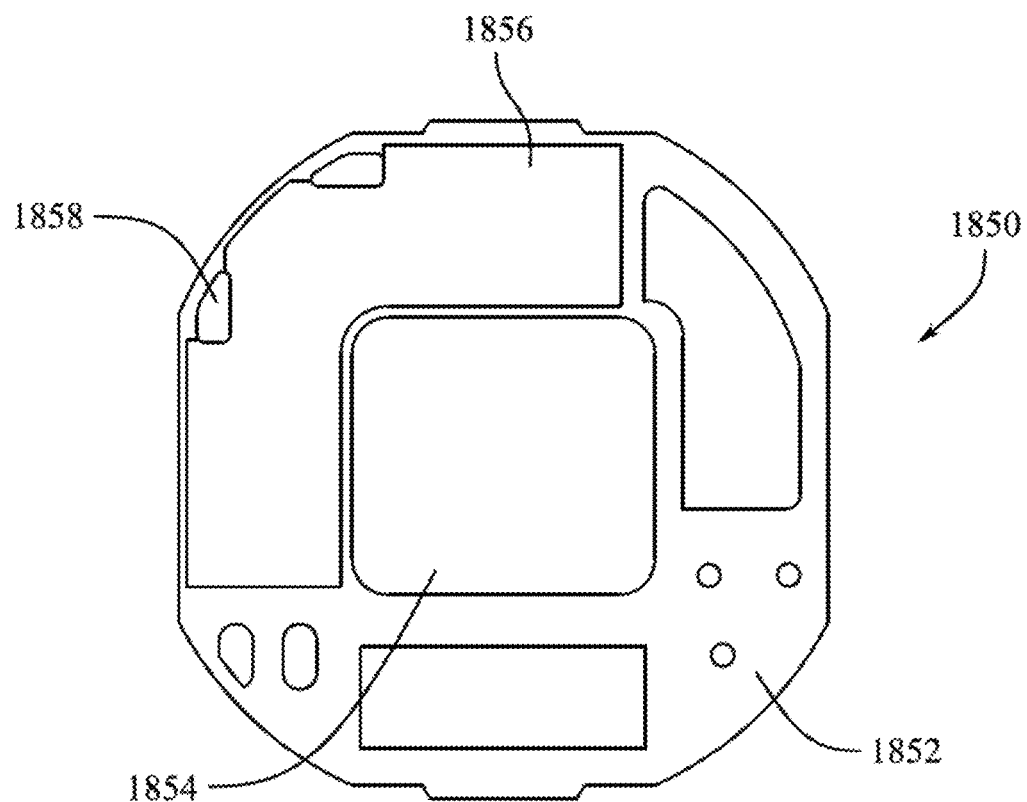
FIG. 13B shows a top view of the component of FIG. 13A.

FIG. 13A shows a perspective view of a logic board 1850 of an electronic device, as described herein. The logic board 1850 can be substantially similar to and can include some or all of the features of the logic boards described herein, such as logic board 1450. The logic board 1850 can include a substrate 1852 that can include any desired material and that can be a printed circuit board. Various components can be disposed on the substrate 1852, such as one or more processors, sensors, and/or memory. One or more of the components can be overmolded with material to provide a SiP 1854, as described herein. Additional components 1856 can be disposed near and/or around the SiP 1854. An adhesive material can be used to connect the logic board 1850 to a back cover of a device, for example, a pressure sensitive adhesive disposed on an underside of the logic board 1850, that is, the side opposite the components 1854, 1856. In order to ensure a desired level of adherence, it can be desirable to exert a pressure on the logic board 1850 against the back cover or other component to which it is adhered. Thus, in some examples, the logic board 1850 can include one or more posts 1858 that can be mechanically connected to the substrate 1852 and on which desired levels of pressure can be exerted, for example by a tool, to ensure desired levels of adherence. In some examples, the post or posts 1858 can be surface mounted to the substrate 1852 by any desired process. FIG. 13B shows a top view of the logic board 1850.

Figure 13C:
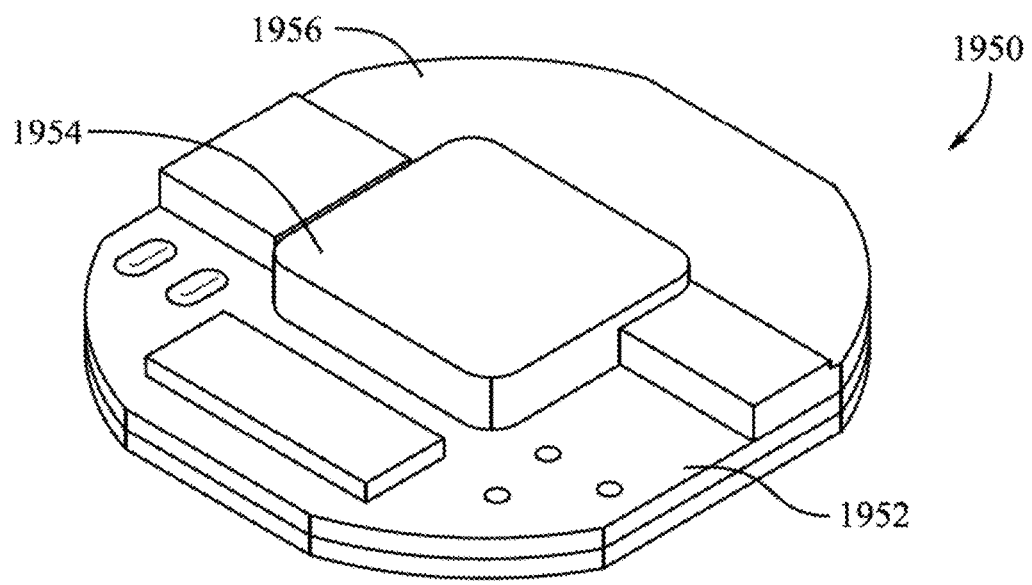
FIG. 13C shows a perspective view of a component of an electronic device.
Figure 13D:
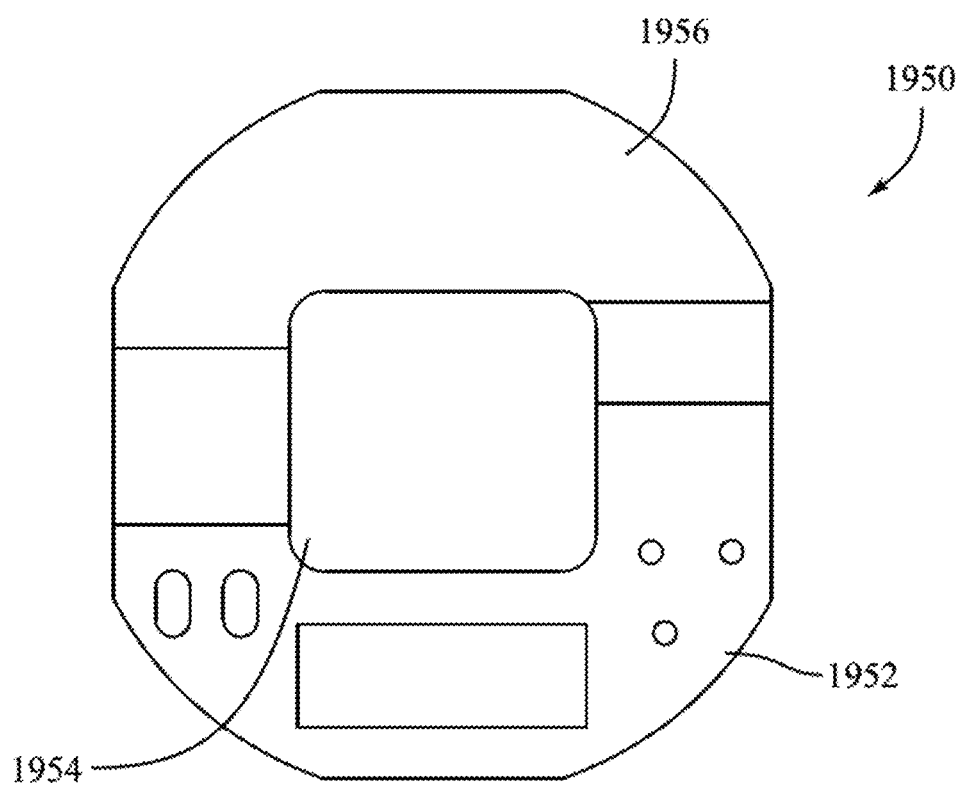
FIG. 13D shows a top view of the component of FIG. 13C.

FIG. 13C shows a perspective view of a logic board 1950 that can be substantially similar to and can include some or all of the features of the logic boards described herein, such as logic board 1850. In this example, the operational components adjacent or near the SiP 1954 that are disposed on the substrate 1952 can also be overmolded with a polymer material 1956, as desired. In this way, pressure can be exerted on the overmold 1956 to ensure a desired level of adherence for the logic board 1950. Additionally, the overmold 1956 can have a stepped geometry, as shown, thereby increasing a gap or distance between portions of the overmold 1956 and any overlying antennas to improve antenna performance. FIG. 13D shows a top view of the logic board 1950.

Any of the features or aspects of the devices and components discussed herein can be combined or included in any varied combination. For example, the design and shape of the components or devices is not limited in any way and can be formed by any number of processes, including those discussed herein. As used herein, the terms exterior, outer, interior, and inner are used for reference purposes only. An exterior or outer portion of a composite component can form a portion of an exterior surface of the component, but may not necessarily form the entire exterior of outer surface thereof. Similarly, the interior or inner portion of a composite component can form or define an interior or inner portion of the component, but can also form or define a portion of an exterior or outer surface of the component.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "including."

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A speaker module, comprising:
   an enclosure defining an aperture;
   a diaphragm integral with the enclosure and positioned in the aperture;
   an integrated acoustic and structural component affixed to the enclosure, the integrated acoustic and structural component comprising:
      a metallic support member defining an exterior surface of the speaker module and defining a substantially flat surface;
      a magnet affixed to the substantially flat surface; and
      an adhesive layer bonding the enclosure to the metallic support member.

2. The speaker module of claim 1, wherein the support member comprises stainless steel.

3. The speaker module of claim 2, wherein the support member comprises a 17-4 stainless steel alloy.

4. The speaker module of claim 1, wherein the support member defines a fixture receiving aperture; and
   further comprising a speaker securing fixture component disposed in the fixture receiving aperture.

5. The speaker module of claim 1, further comprising a pressure sensor module disposed on the support member.

6. The speaker module of claim 5, further comprising a flexible electrical connector, the flexible electrical connector comprising:
   a first portion electrically connected to a driver of the speaker module;
   a second portion electrically connected to the pressure sensor module; and
   a connection portion in electrical communication with the first portion and the second portion.

7. The speaker module of claim 6, wherein:
   the first portion and the second portion are shaped to lay substantially flat against a surface of the support member; and
   the connection portion is shaped to extend away from the surface.

8. The speaker module of claim 1, wherein the magnet has a substantially rectangular shape.

9. The speaker module of claim 1, wherein:
   the magnet comprises a first magnet; and
   the integrated acoustic and structural component further comprises a second magnet affixed to the substantially flat surface, and a third magnet affixed to the substantially flat surface.

10. An electronic device, comprising:
    a housing at least partially defining an internal volume and an aperture in communication with the internal volume and an ambient environment; and
    a speaker module positioned at the aperture and sealed to the housing to define a liquid barrier, the speaker module comprising:
       a metallic support member partially defining the internal volume and a flat mounting surface;
       a magnet affixed to the flat mounting surface;
       a speaker module enclosure affixed to the metallic support member; and
       a diaphragm formed with the speaker module enclosure and positioned opposite the magnet.

11. The electronic device of claim 10, wherein the electronic device is water resistant to a depth of at least 50 m.

12. The electronic device of claim 10, wherein the speaker module further comprises a pressure sensor disposed on the metallic support member and in communication with the ambient environment through the aperture.

13. The electronic device of claim 10, wherein the metallic support member has a constant thickness at a location of the magnet.

14. The electronic device of claim 10, wherein the flat surface has a flatness of less than about 0.05.

15. The electronic device of claim 10, wherein the speaker module has a thickness of less than about 5 mm.

16. The electronic device of claim 10, wherein the metallic support member is formed by metal injection molding.

17. A speaker module, comprising:
    a metallic support member defining an exterior surface of the speaker module and a planar mounting surface having a height and a width greater than the height;
    a first magnet affixed to the mounting surface adjacent to a first edge;
    a second magnet affixed to the mounting surface adjacent to a second edge;
    a third magnet affixed to the mounting surface between the first magnet and the second magnet, the mounting surface having a constant thickness across an entire area of the third magnet;

an enclosure affixed to the metallic support member, the enclosure at least partially defining an internal volume encompassing the first magnet, the second magnet, and the third magnet; and a diaphragm integrally connected with the enclosure.

18. The speaker module of claim 17, wherein the first magnet, the second magnet, and the third magnet comprise permanent magnets.

19. The speaker module of claim 17, wherein the metallic support member comprises stainless steel.

20. The speaker module of claim 17, wherein the metallic support member is metal injection molded.

* * * * *